US012183618B2

(12) United States Patent
Baluja et al.

(10) Patent No.: US 12,183,618 B2
(45) Date of Patent: Dec. 31, 2024

(54) APPARATUS AND METHODS TO TRANSFER SUBSTRATES INTO AND OUT OF A SPATIAL MULTI-SUBSTRATE PROCESSING TOOL

(71) Applicant: Applied Materials, Inc., Santa Clara, CA (US)

(72) Inventors: Sanjeev Baluja, Campbell, CA (US); Tejas Ulavi, San Jose, CA (US); Eric J. Hoffmann, San Francisco, CA (US); Ashutosh Agarwal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1001 days.

(21) Appl. No.: 17/061,015

(22) Filed: Oct. 1, 2020

(65) Prior Publication Data

US 2022/0106683 A1    Apr. 7, 2022

(51) Int. Cl.
| | | |
|---|---|---|
| H01L 21/687 | (2006.01) | |
| C23C 16/455 | (2006.01) | |
| C23C 16/458 | (2006.01) | |

(52) U.S. Cl.
CPC .. *H01L 21/68742* (2013.01); *C23C 16/45544* (2013.01); *C23C 16/4584* (2013.01); *C23C 16/4586* (2013.01); *H01L 21/68771* (2013.01)

(58) Field of Classification Search
CPC ......... H01L 21/68742; H01L 21/68771; C23C 16/4586; C23C 16/45544; C23C 16/4584
See application file for complete search history.

(56) References Cited

U.S. PATENT DOCUMENTS

| | | | |
|---|---|---|---|
| 3,015,709 | A | 1/1962 | Bodenschatz |
| 4,790,258 | A | 12/1988 | Drage et al. |
| 5,823,153 | A | 10/1998 | Santi et al. |
| 6,032,691 | A | 3/2000 | Powell et al. |
| 6,148,762 | A | 11/2000 | Fukuda et al. |
| 6,389,677 | B1 | 5/2002 | Lenz |
| 6,550,484 | B1 | 4/2003 | Gopinath |
| 6,572,708 | B2 * | 6/2003 | Gujer ................ C23C 16/4586 |
| | | | 118/500 |

(Continued)

FOREIGN PATENT DOCUMENTS

| | | |
|---|---|---|
| CN | 100440476 C | 12/2008 |
| CN | 101352108 A | 1/2009 |

(Continued)

OTHER PUBLICATIONS

"PCT International Search Report and Written Opinion in PCT/US2021/052564 dated Jan. 14, 2022, 11 pages".

*Primary Examiner* — Kurt Sweely
(74) *Attorney, Agent, or Firm* — Servilla Whitney LLC

(57) ABSTRACT

Apparatus and methods for loading and unloading substrates from a spatial processing chamber are described. A support assembly has a rotatable center base and support arms extending therefrom. A support shaft is at the outer end of the support arms and a substrate support is on the support shaft. Primary lift pins are positioned within openings in the substrate support. Secondary lift pins are positioned within openings in the support arms and are aligned with the primary lift pins. An actuation plate within the processing volume causes, upon movement of the support assembly, the primary lift pins to elevate through contact with the secondary lift pins.

18 Claims, 15 Drawing Sheets

(56) References Cited

U.S. PATENT DOCUMENTS

| | | | |
|---|---|---|---|
| D504,313 S | 4/2005 | Stoewer | |
| 6,884,319 B2 | 4/2005 | Kim | |
| 6,887,317 B2 * | 5/2005 | Or | C23C 16/4583 |
| | | | 156/345.52 |
| 7,160,392 B2 | 1/2007 | Shang et al. | |
| 7,180,283 B2 | 2/2007 | Hunger et al. | |
| 7,187,188 B2 | 3/2007 | Andrews et al. | |
| 7,292,428 B2 | 11/2007 | Hanawa et al. | |
| D568,914 S | 5/2008 | Or et al. | |
| 7,871,470 B2 * | 1/2011 | Schieve | H01L 21/68742 |
| | | | 156/345.23 |
| D635,597 S | 4/2011 | Tiner | |
| D640,715 S | 6/2011 | Tiner | |
| D650,818 S | 12/2011 | Tiner | |
| 8,230,931 B2 | 7/2012 | Rodriguez et al. | |
| 9,083,182 B2 * | 7/2015 | Sato | H01J 37/32944 |
| 9,721,910 B2 * | 8/2017 | Hamaguchi | H01J 37/32715 |
| 10,192,770 B2 | 1/2019 | Yudovsky | |
| 10,262,888 B2 | 4/2019 | Gangakhedkar et al. | |
| 2003/0136341 A1 * | 7/2003 | Na | H01L 21/68742 |
| | | | 118/500 |
| 2004/0045509 A1 | 3/2004 | Or | |
| 2005/0000453 A1 | 1/2005 | Hwang et al. | |
| 2005/0194100 A1 | 9/2005 | Or et al. | |
| 2006/0156988 A1 * | 7/2006 | Wu | H01L 21/68742 |
| | | | 118/728 |
| 2007/0089672 A1 | 4/2007 | Shimamura | |
| 2008/0134814 A1 | 6/2008 | Kim et al. | |
| 2010/0212594 A1 * | 8/2010 | Hara | C23C 16/4401 |
| | | | 118/69 |
| 2010/0212832 A1 | 8/2010 | Wakasaki et al. | |
| 2011/0287631 A1 | 11/2011 | Yamamoto | |
| 2013/0333616 A1 | 12/2013 | Klindworth et al. | |
| 2014/0097175 A1 | 4/2014 | Yu et al. | |
| 2017/0125280 A1 * | 5/2017 | Ghosh | H01L 21/68742 |
| 2019/0051555 A1 | 2/2019 | Hill et al. | |
| 2019/0131167 A1 * | 5/2019 | Rice | C23C 16/45551 |

FOREIGN PATENT DOCUMENTS

| | | |
|---|---|---|
| EP | 1174910 A2 | 1/2002 |
| JP | 61214937 A | 9/1986 |
| KR | 20090132335 A | 12/2009 |
| WO | 2010109373 A2 | 9/2010 |

* cited by examiner

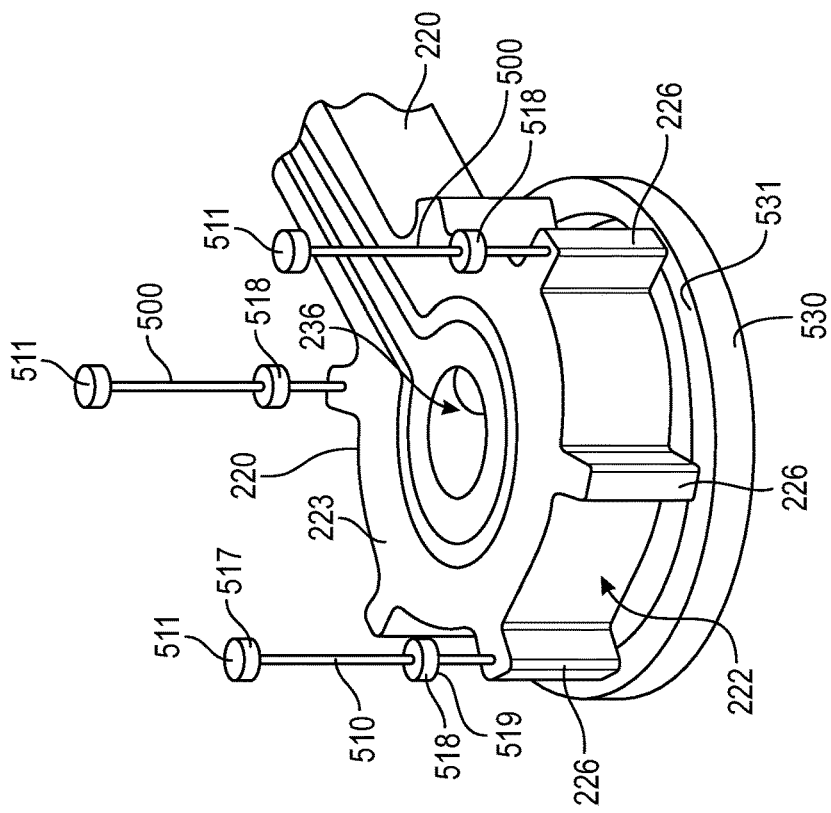
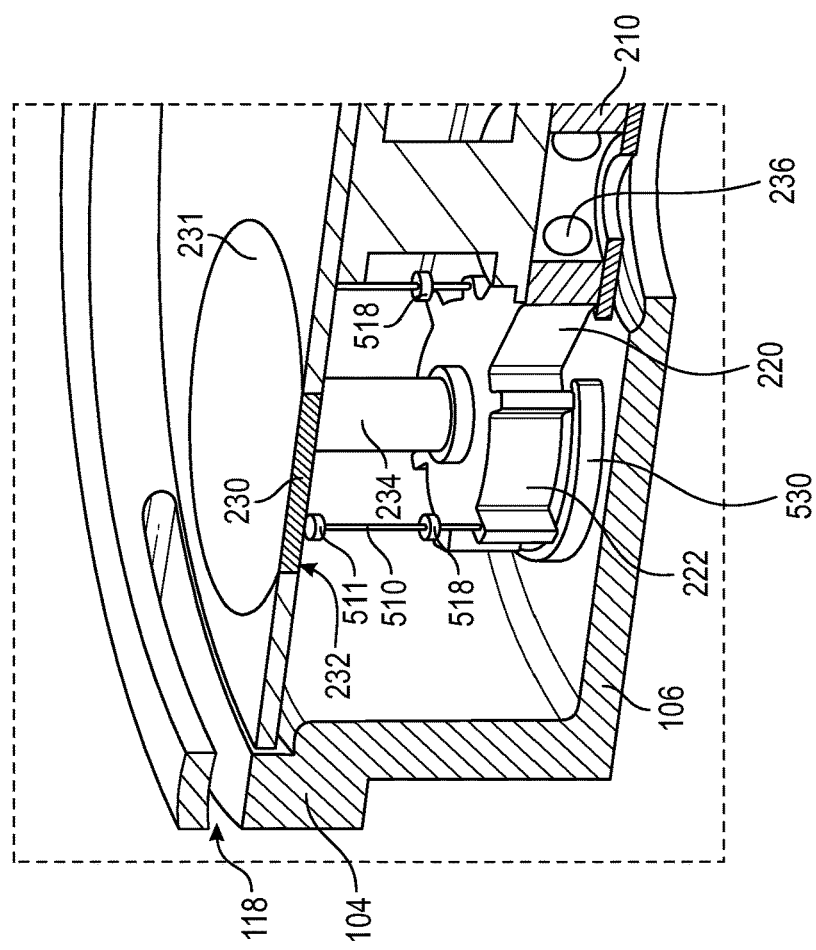
FIG. 7
FIG. 8

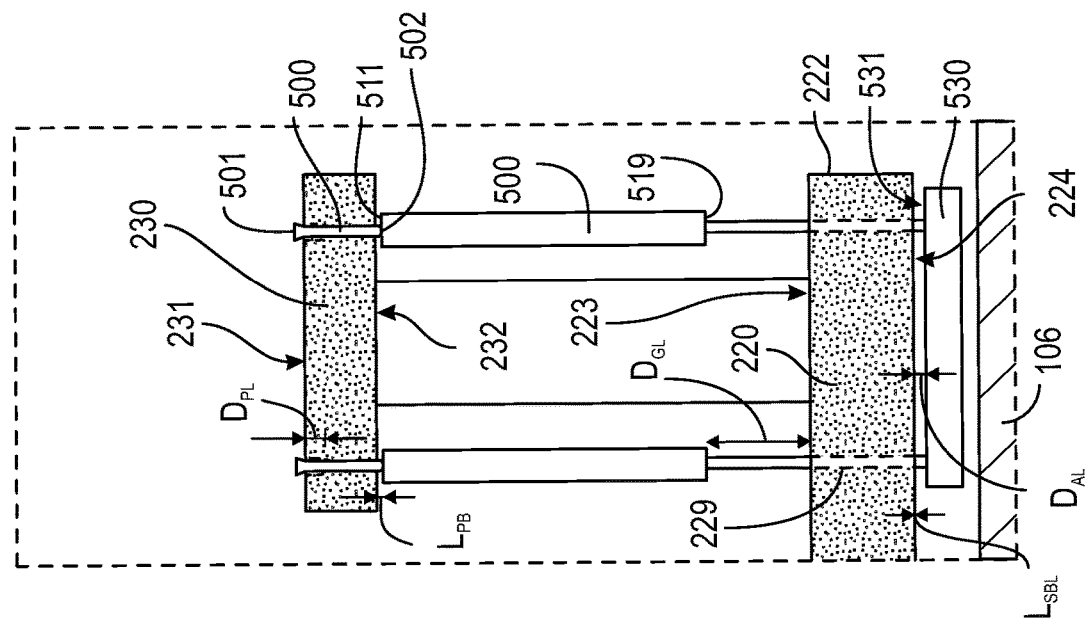
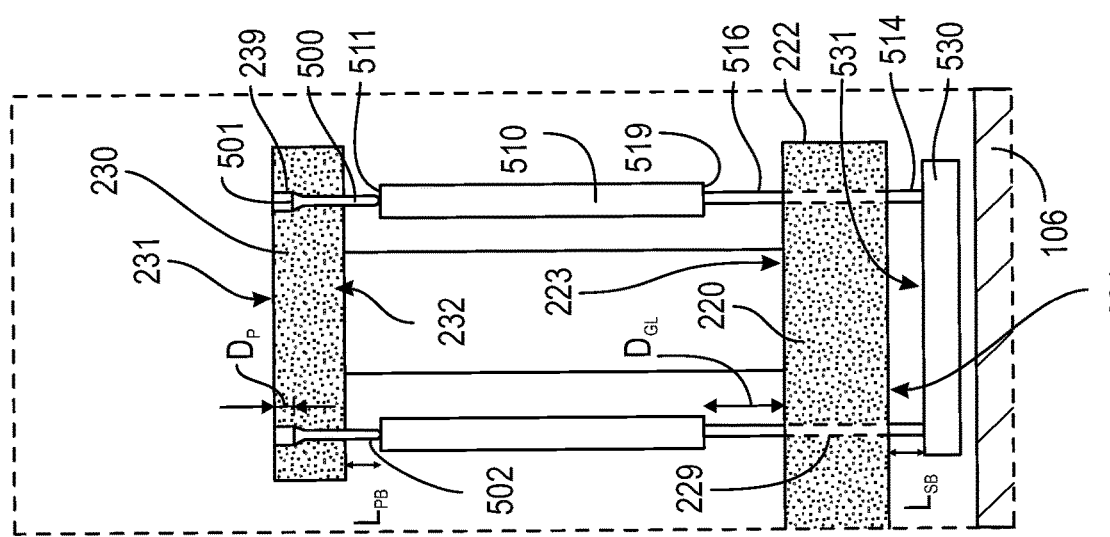
FIG. 11C
FIG. 11D

APPARATUS AND METHODS TO TRANSFER SUBSTRATES INTO AND OUT OF A SPATIAL MULTI-SUBSTRATE PROCESSING TOOL

TECHNICAL FIELD

Embodiments of the disclosure generally relate to semiconductor manufacturing equipment. In particular, embodiment of disclosure relate to apparatus and methods for loading and unloading substrates into a multi-substrate processing tool.

BACKGROUND

Traditional time-domain atomic layer deposition (ALD) processes flow reactive gas into the processing chamber separately to avoid gas phase reactions. The individual reactive gas exposures are separated by a purge/pump period. The pump/purge period is often much longer than the reactive gas exposure times and can become rate limiting to the overall deposition process. A spatial ALD chamber can move one or more substrate(s) from one environment to a second environment faster than a time-domain ALD chamber can pump/purge, resulting in higher throughput.

Current spatial ALD processing chambers rotate a plurality of substrates on a heated circular platen at a constant speed which moves the substrates from one processing environment to an adjacent environment. The different processing environments create a separation of the incompatible gases. However, current spatial ALD processing chambers do not enable the plasma environment to be optimized for plasma exposure, resulting in non-uniformity, plasma damage and/or processing flexibility issues.

For example, the process gases flow across the substrate surface. Because the substrate is rotating about an offset axis, the leading edge and trailing edge of the substrate have different flow streamlines. Additionally, there is also a flow difference between the inner diameter edge and outer diameter edge of the substrate caused by the slower velocity at the inner edge and faster at the outer edge. These flow non-uniformities can be optimized but not eliminated. Plasma damage can be created when exposing a substrate to non-uniform plasma. The constant speed rotation of spatial processing chambers causes the substrates to move into and out of a plasma and therefore some of the substrate is exposed to plasma while other areas are outside of the plasma. The current spatial ALD chambers can only slow down or speed up the rotation speed but cannot adjust for time differences between the steps without changing the chamber hardware for smaller or larger areas.

Additionally, conventional multi-substrate spatial processing chambers require large Z-axis traveling to provide sufficient room for the lift pin actuation mechanisms to allow for the loading and unloading of substrates. In some process chambers, the Z-axis travel of the chamber spindle (pedestal) is limited to a maximum of about 80 mm due to physical space constraints.

Lift pin actuation mechanisms need to clear the moving parts of the process chamber during normal operation. Generally, lift pins are subjected to acceleration and deceleration forces many times over a short period. For example, lift pins of some conventional spatial processing tools need to survive 2.5 g peak accelerations at 2 Hz for up to 60 million cycles over a three year period. Premature failure of the lift pins results in loss of throughput and expenses associated with repair and replacement of broken or worn out parts.

Additionally, the lift pin mechanism must work safely and reliably with electrostatic chucks. The lift pins in electrostatic chucks may be subjected to large voltage differentials and must not cause shorting or arcing between the electrodes.

Accordingly, there is a need for apparatus and methods to improve substrate loading and unloading in substrate processing chambers.

SUMMARY

One or more embodiments of the disclosure are directed to process chambers comprising a support assembly and an actuation plate. The support assembly comprises a rotatable center base defining a rotational axis. The rotatable center base is movable along the rotational axis. At least two support arms extend from the center base. Each of the support arms has an inner end in contact with the center base, and a top surface and a bottom surface defining a thickness of the support arms. The support shaft is at an outer end of each of the support arms. A substrate support is on each of the support shafts. The substrate support has a support surface and a bottom surface defining a thickness of the substrate support. The bottom surface is spaced a distance from the top surface of the support arm.

At least three primary lift pins are positioned within openings in each of the substrate supports. Each of the primary lift pins has a top end and a bottom end defining a length of the primary lift pin. The primary lift pins and openings are configured to cooperatively interact to prevent the primary lift pins from passing fully through the bottom surface of the substrate support.

At least three secondary lift pins are positioned within openings in the support arms. The secondary lift pins are aligned with the primary lift pins. Each of the secondary lift pins has a top end and a bottom end defining a length. At least a portion of the bottom end extends from the bottom surface of the support arm. The secondary lift pins and openings in the support arms are configured to cooperatively interact to prevent the secondary lift pins from passing fully through the bottom surface of the support arms.

An actuation plate is positioned at a distance from the rotational axis to align with the outer end the support arms. The actuation plate has an actuation surface spaced a distance from the bottom surface of the support arm.

Additional embodiments of the disclosure are directed to processing methods. A support assembly within a processing chamber is rotated to align an outer end of a support arm of the support assembly with an actuation plate in the processing chamber. The support assembly rotates around a rotational axis. The support assembly is moved along the rotational axis toward the actuation plate so that a bottom end of a plurality of secondary lift pins contacts the actuation plate. The secondary lift pins have a length defined by a top end and the bottom end. The secondary lift pins pass through a thickness of the support arm. Movement of the support assembly is continued along the rotational axis toward the actuation plate to cause the top ends of the secondary lift pins to contact bottom ends of primary lift pins and push the primary lift pins so that a top end of the primary lift pins extends from a top surface of a substrate support on top of a support shaft connected to the outer end of the support assembly.

Further embodiments of the disclosure are directed to non-transitory computer readable medium including instructions, that, when executed by a controller of a processing chamber, causes the processing chamber to perform operations of: rotating a support assembly around a rotational axis to align an outer end of a substrate support arm of the support assembly with an actuation plate; moving the support assembly along the rotational axis, toward the actuation plate so that a bottom end of a plurality of secondary lift pins contact the actuation plate, the secondary lift pins having a length defined by a top end and the bottom end, the secondary lift pins passing through a thickness of the support arm, and cause the top ends of the secondary lift pins to contact bottom ends of primary lift pins and push the primary lift pins so that a top end of the primary lift pins extends from a top surface of a substrate support on top of a support shaft connected to the outer end of the support assembly; open a access port in a side of the processing chamber; and loading a substrate into the processing chamber onto the top end of the primary lift pins.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 7 is a partial cross-sectional isometric view of a support assembly in an exchange position according to one or more embodiment of the disclosure;

FIG. 8 is a partial isometric view of an outer end of a support arm according to one or more embodiment of the disclosure;

FIGS. 11A through 11D illustrate a partial schematic view of a method for loading and/or unloading substrates onto a support assembly according to one or more embodiment of the disclosure;

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" (also referred to as a "wafer") as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Figure 1:
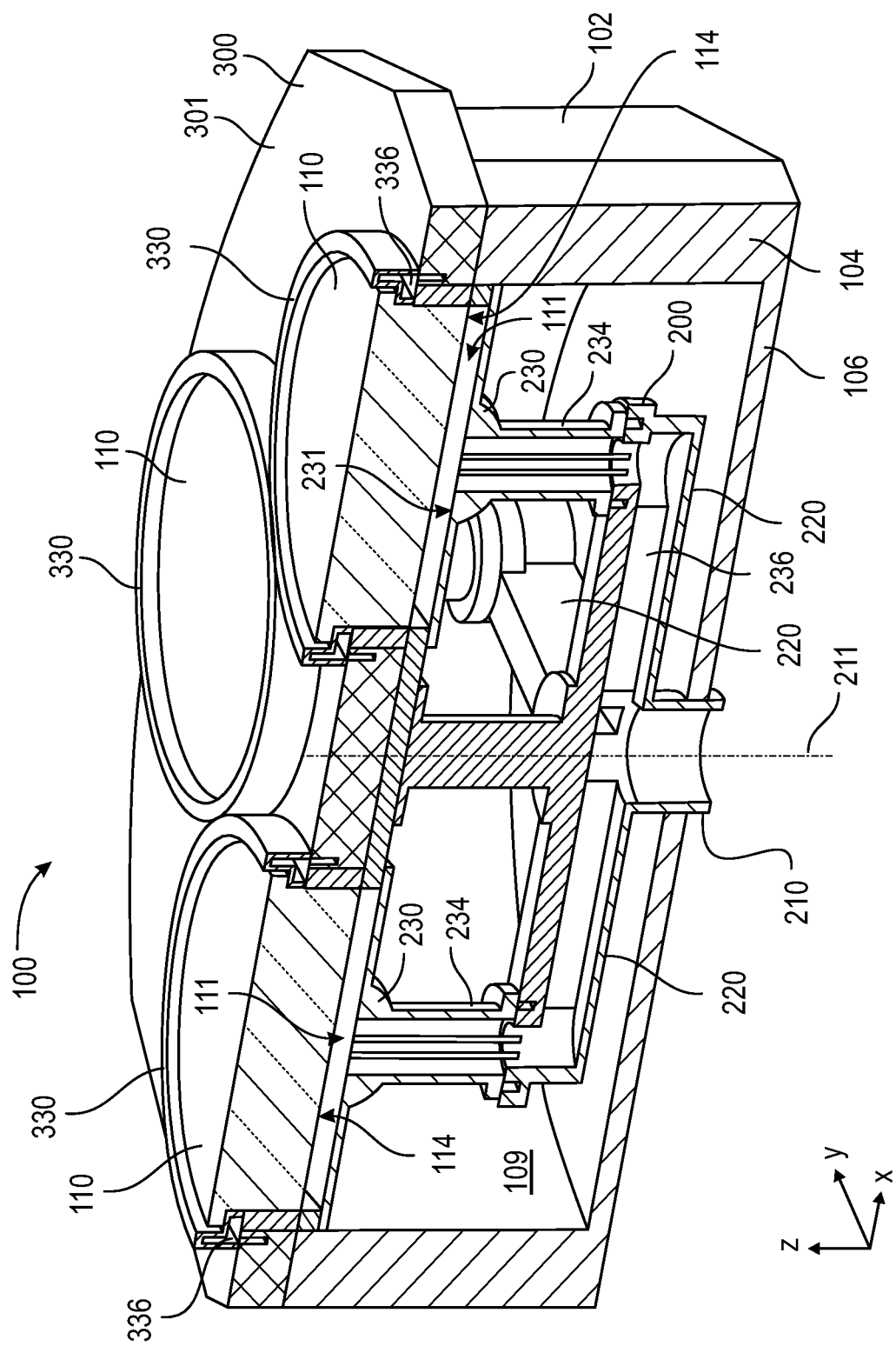
FIG. 1 shows a cross-sectional isometric view of a processing chamber in accordance with one or more embodiment of the disclosure.
Figure 2:
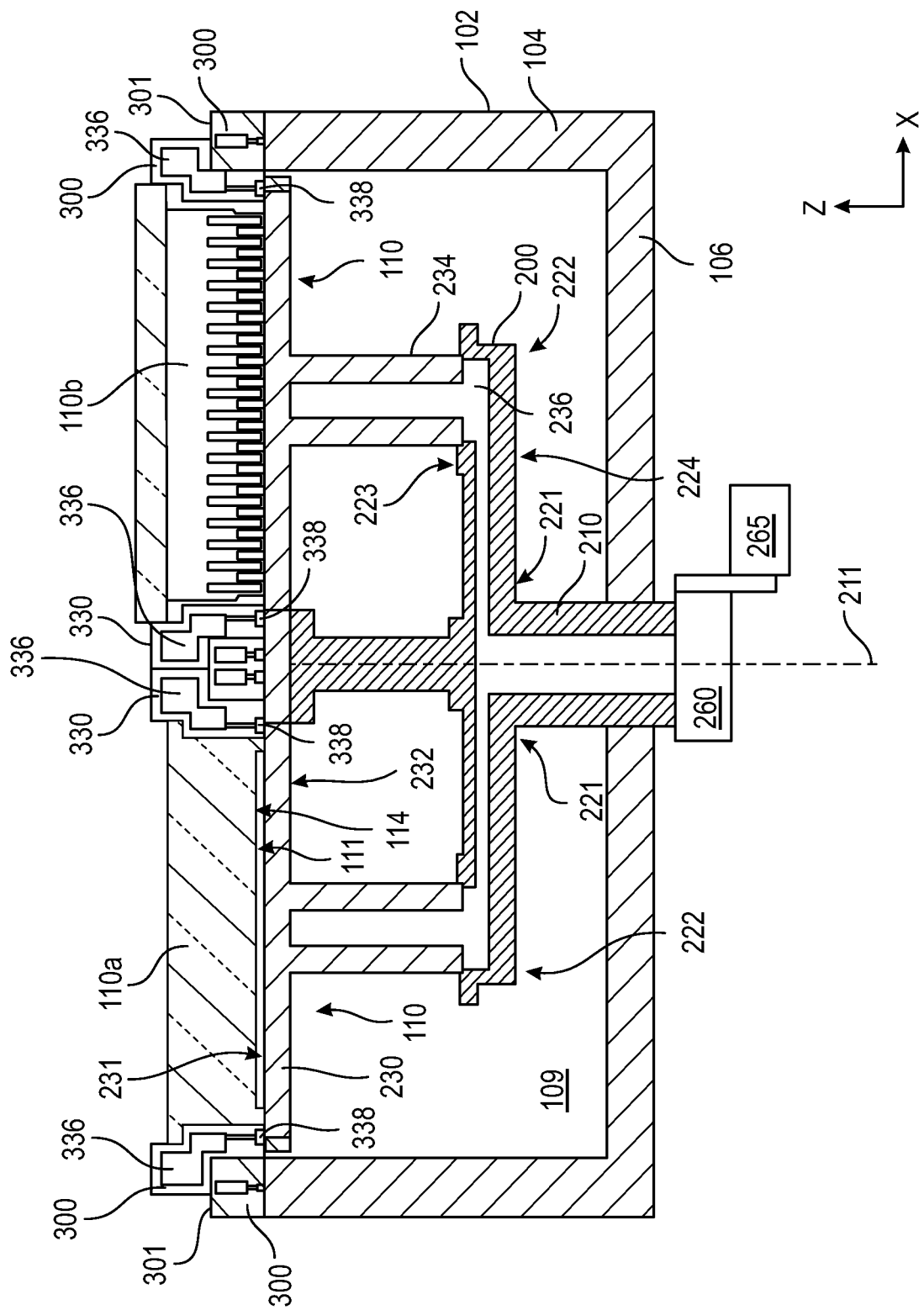
FIG. 2 shows a cross-sectional view of a processing chamber in accordance with one or more embodiment of the disclosure.

FIGS. 1 and 2 illustrate a processing chamber 100 in accordance with one or more embodiment of the disclosure. FIG. 1 shows the processing chamber 100 illustrated as a cross-sectional isometric view and in accordance with one or more embodiment of the disclosure. FIG. 2 shows a processing chamber 100 in cross-section according to one or more embodiment of the disclosure.

The processing chamber 100 has a housing 102 with walls 104 and a bottom 106. The housing 102 along with the top plate 300 define an interior volume 109. The processing chamber 100 incorporates a substrate support assembly 200. As used in this manner, an "assembly" refers to a combination of components or parts. A substrate support assembly 200 according to one or more embodiments comprises at least a support shaft 234 and a substrate support 230, as described further below.

The processing chamber 100 illustrated includes a plurality of processing stations 110. The processing stations 110 are located in the interior volume 109 of the housing 102 and are positioned in a circular arrangement around the rotational axis 211 of the substrate support 200. Each processing station 110 comprises a gas injector 112 (also referred to as a gas injector) having a front surface 114. The processing stations 110 are defined as a region in which processing can occur. For example, in some embodiments, a processing station 110 is defined as a region, or process volume 111, bounded by the support surface 231 of the substrate support 200, as described below, and the front surface 114 of the gas injector 112. The gas injector 112, as discussed further below, is a part of the gas distribution assembly 105.

The processing stations 110 can be configured to perform any suitable process and provide any suitable process conditions. The type of gas injector 112 used will depend on, for example, the type of process being performed and/or the type of showerhead or gas distribution plate. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the substrate. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations (e.g., chemical vapor deposition (CVD), atomic layer deposition (ALD)), microwave plasma, three-electrode CCP, ICP, parallel plate CCP, physical vapor deposition (PVD), UV exposure, laser processing, pumping chambers, annealing stations and metrology stations.

In some embodiments, the support assembly 200 includes a rotatable center base 210. The rotatable center base 210 defines a rotational axis 211 that extends along a first direction. As a coordinate system, the rotational axis 211 extends along the Z direction so that rotation around the rotational axis 211 occurs in the X-Y plane. The first direction may be referred to as the vertical direction or along the Z-axis; however, it will be understood that use of the term "vertical" in this manner is not limited to a direction normal to the pull of gravity. As used herein, when the center base 210 is "rotated" around the rotational axis 211, the center base 210 is spinning in the X-Y plane. As used herein, movement "along" the rotational axis 211 or the first direction means that the center base 210, or stated component, is moving in the Z-axis.

The support assembly 200 includes at least two support arms connected to and extending from the center base 210. Each of the support arms 220 has a top surface 223 and the bottom surface 224 that define a thickness of the support arm 220. The support arms 220 have an inner end 221 and an outer end 222. The inner end 221 is in contact with the center base 210 so that when the center base 210 rotates around the rotational axis 211, the support arms 220 rotate as well. The support arms 220 of some embodiments are connected to the center base 210 at the inner end 221 by fasteners (e.g., bolts). In some embodiments, the support arms 220 are integrally formed with the center base 210.

In some embodiments, the support arms 220 extend orthogonal to the rotational axis 211 so that one of the inner ends 221 or outer ends 222 are further from the rotational axis 211 than the other of the inner ends 221 and outer ends 222 on the same support arm 220. In some embodiments, the inner end 221 of the support arm 220 is closer to the rotational axis 211 than the outer end 222 of the same support arm 220.

The number of support arms 220 in the support assembly 200 can vary. In some embodiments, there are at least two support arms 220, at least three support arms 220, at least four support arms 220, or at least five support arms 220. In some embodiments, there are three support arms 220. In some embodiments, there are four support arms 220. In some embodiments, there are five support arms 220. In some embodiments, there are six support arms 220.

The support arms 220 can be arranged symmetrically around the center base 210. For example, in a support assembly 200 with four support arms 220, each of the support arms 220 are positioned at 90° intervals around the center base 210. In a support assembly 200 with three support arms 220, the support arms 220 are positioned at 120° intervals around the center base 210. Stated differently, in embodiments with four support arms 220, the support arms are arrange to provide four-fold symmetry around the rotational axis 211. In some embodiments, the support assembly 200 has n-number of support arms 220 and the n-number of support arms 220 are arranged to provide n-fold symmetry around the rotation axis 211. In some embodiments, there is the same number of support arms 220 as process stations 110.

In some embodiments, a support shaft 234 is located at the outer end 222 of each of the support arms 220. The support shaft 234 acts as a standoff to space the substrate support 230 a distance from the top surface 223 of the support arms 220 along the first direction.

A substrate support 230 is positioned at the outer ends 222 of the support arms 220. In some embodiments, the substrate support 230 is positioned on the support shaft 234 at the outer ends 222 of the support arms 220. The center of the substrate supports 230 are located at a distance from the rotational axis 211 so that upon rotation of the center base 210 the substrate supports 230 move in a circular path offset from the rotational axis.

The substrate supports 230 have a support surface 231 configured to support a substrate during processing. In some embodiments, the support surfaces 231 of all of the substrate supports 230 are substantially coplanar. As used in this manner, "substantially coplanar" means that the planes formed by the individual support surfaces 231 are within ±5°, ±4°, ±3°, ±2° or ±1° of the planes formed by the other support surfaces 231.

In some embodiments, a channel 236 is formed in one or more of the center base 210, the support arms 220, support shaft 234 and/or the substrate support 230. The channel 236 can be used to route electrical connections or to provide a gas flow. In some embodiments, the substrate support 230 comprises one or more heating element 235 (see FIGS. 5 and 6)

The substrate supports 230 of some embodiments are heaters. The heaters can be any suitable type of heater known to the skilled artisan. In some embodiments, the heater is a resistive heater with one or more heating elements 235 within a heater body. Electrical connection to the heaters in some embodiments is routed through the channel 236.

In some embodiments, the substrate supports 230 comprise an electrostatic chuck. The electrostatic chuck can include various wires and electrodes so that a substrate positioned on the heater support surface 231 can be held in place while the substrate support is moved. In some embodiments, the substrate support 230 comprises a heater and an electrostatic chuck. This allows a wafer to be chucked onto a heater at the beginning of a process and remain in that same position on that same heater while moving to different process stations.

Figure 3:
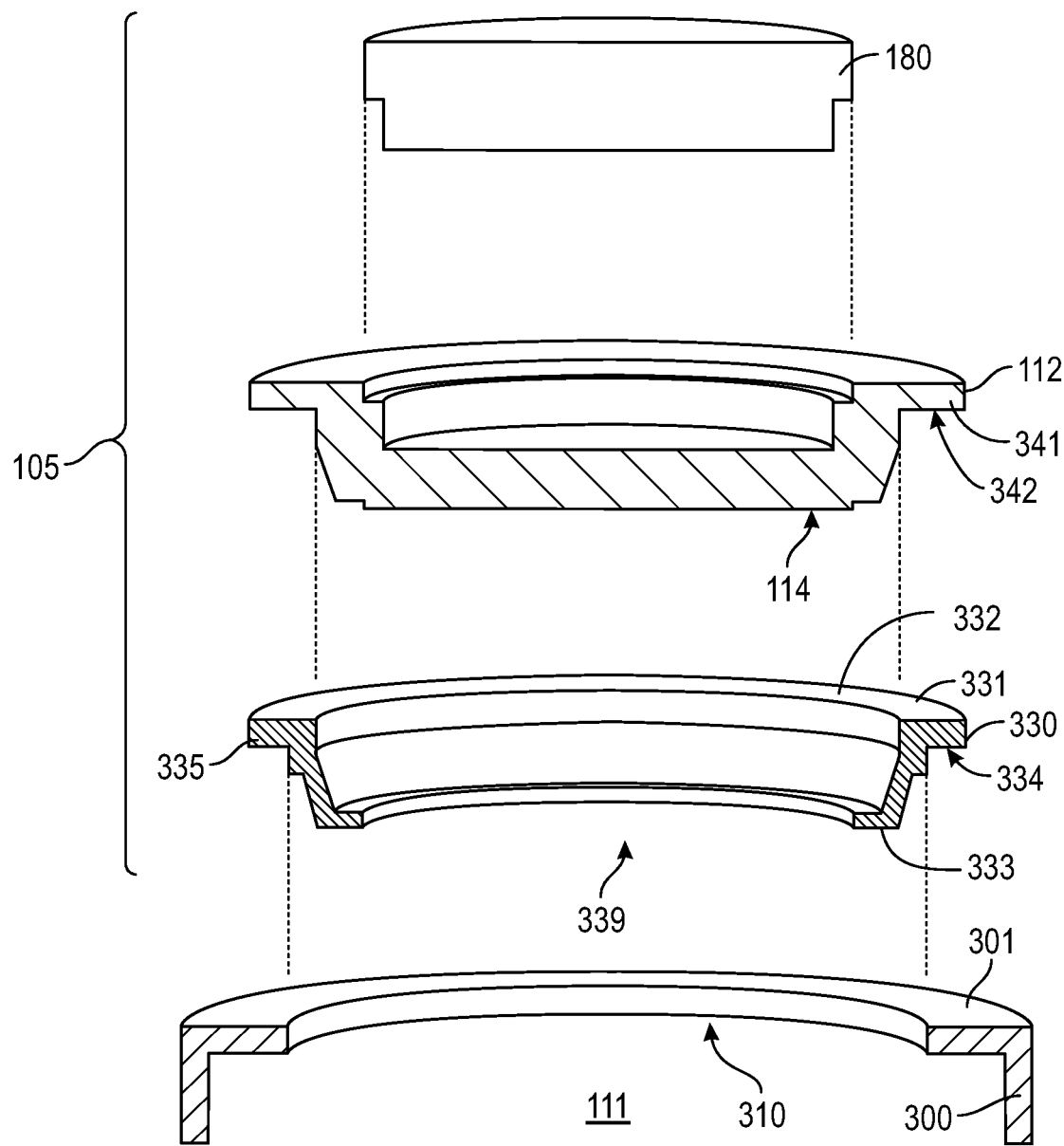
FIG. 3 is an exploded cross-sectional view of a processing station in accordance with one or more embodiment of the disclosure.

FIG. 3 illustrates an exploded view of a gas distribution assembly 105 for use in a processing station 110 or a process chamber in accordance with one or more embodiment of the disclosure. The skilled artisan will recognize that the embodiment illustrated in FIG. 3 is a general schematic representation and omits details (e.g., gas channels). The gas distribution assembly 105 illustrated comprises three main components: a gas distribution plate 112, a lid 180 and an optional spacer 330. The spacer 330 is also referred to as a pump/purge spacer, insert or pump/purge insert, liner or pump/purge liner. In some embodiments, the spacer 330 is connected to or in fluid communication with a vacuum (exhaust). In some embodiments, the spacer 330 is connected to or in fluid communication with a purge gas source.

The openings 310 in the top plate 300 can be uniformly sized or have different sizes. Different sized/shape gas injectors 112 can be used with a pump/purge spacer 330 that is suitably shaped to transition from the opening 310 to the gas distribution plate 112. For example, as illustrated, the pump/purge spacer 330 includes a top 331 and bottom 333 with a sidewall 335. When inserted into the opening 310 in the top plate 300, a ledge 334 configured to be positioned on the top surface 301 of the lid 300 around a periphery of the opening 310.

The pump/purge spacer 330 includes an opening 339 in which a gas distribution plate 112 can be inserted. The gas distribution plate 112 illustrated has a flange 341 with a contact surface 342. The contact surface 342 of the flange 341 is configured to contact the back surface 332 at the top 331 of the pump/purge spacer 330. The diameter or width of the gas distribution plate 112 can be any suitable size that can fit within the opening 339 of the pump/purge spacer 330. This allows gas injectors 112 of various types to be used within the same opening 310 in the top plate 300.

Figure 4:
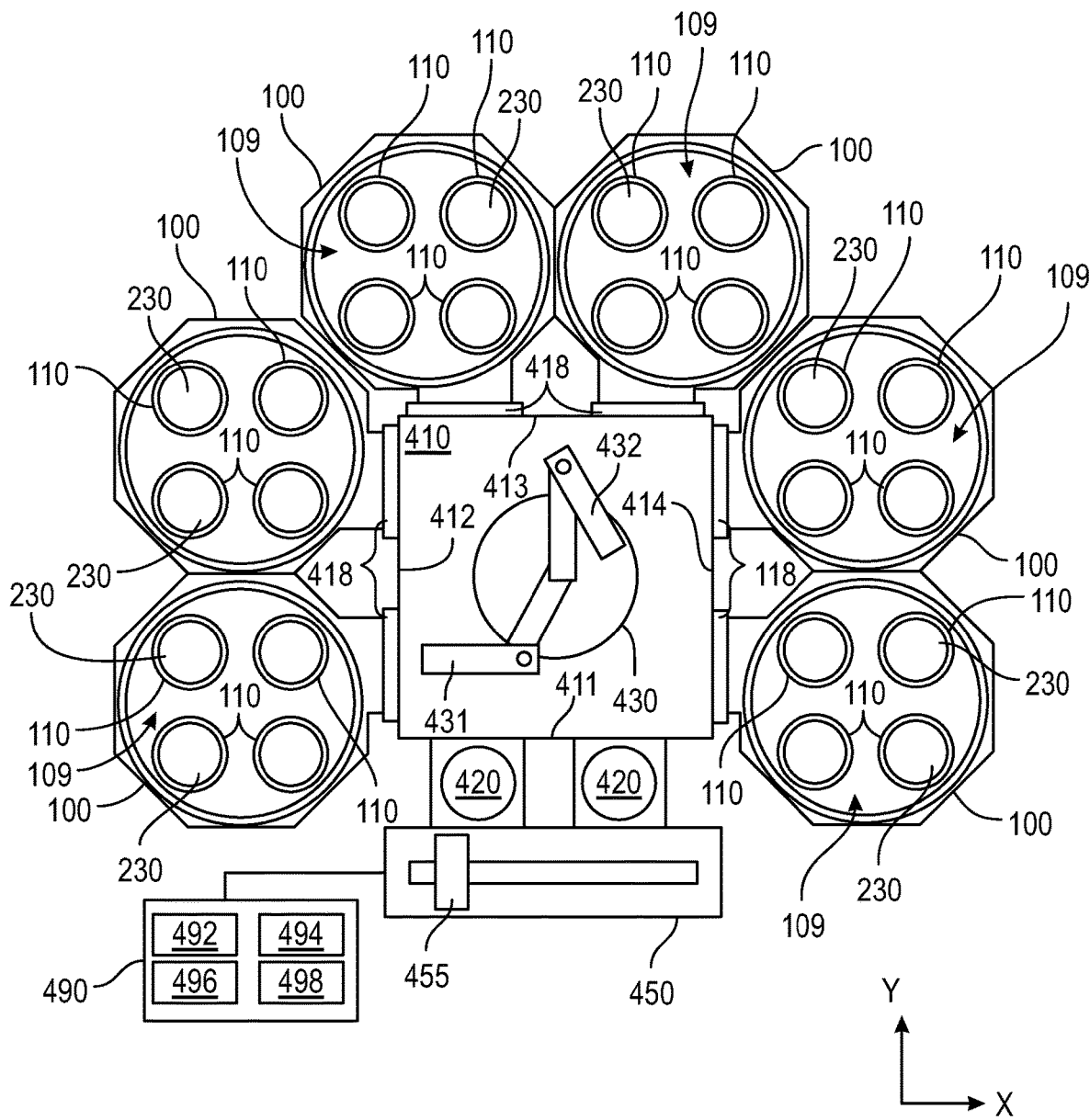
FIG. 4 is a schematic representation of a processing platform in accordance with one or more embodiment of the disclosure.

The pump/purge spacer 330 of some embodiments includes a gas plenum 336 with at least one opening 338 in the bottom 333 of the pump/purge spacer 330. The gas plenum 336 has an inlet (not shown), typically near the top 331 or sidewall 335 of the pump/purge spacer 330. In some embodiments, the plenum 336 is connected to a vacuum pump or other vacuum source to direct gas escaping the process volume 111 through the opening 338 in the bottom 333 of the pump/purge insert 330 to create a gas curtain type barrier to prevent leakage of process gases from the interior of the processing chamber FIG. 4 shows a processing platform 400 in accordance with one or more embodiment of the disclosure. The embodiment shown in FIG. 4 is merely representative of one possible configuration and should not be taken as limiting the scope of the disclosure. For example, in some embodiments, the processing platform 400 has a different numbers or types of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides, eight sides or more.

The transfer station 410 has a robot 430 positioned therein. The robot 430 can be any suitable robot capable of moving a substrate during processing. In some embodiments, the robot 430 has a first arm 431 and a second arm 432. The first arm 431 and second arm 432 of some embodiments are configured to be moved independently of the other arm. The first arm 431 and second arm 432 of some embodiments are configured to move in the X-Y plane and/or along the Z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. The processes performed in each of the processing chambers 100 is independent of the processes performed in any of the other processing chambers. In some embodiments, all of the processing chambers 100 are configured to perform the same process to improve throughput by a multiple of the number of processing chambers 100.

The illustrated processing platform 400 also includes one or more buffer station 420 connected to the first side 411 of the central transfer station 410. The buffer stations 420 can perform the same or different functions. For example, the buffer stations may hold a cassette of substrates which are processed and returned to the original cassette, or one of the buffer stations may hold unprocessed substrates which are moved to the other buffer station after processing. In some embodiments, one or more of the buffer stations are configured to pre-treat, pre-heat or clean the substrates before and/or after processing. In some embodiments, one or more of the buffer stations are configured to anneal or post-process substrates before and/or after processing.

The processing platform 400 may also include one or more access ports 418 between the central transfer station 410 and any of the processing chambers 100. The access ports 418 are configured to open and close to isolate the interior volume 109 within the processing chamber 100 from the environment within the central transfer station 410. For example, if the processing chamber will generate plasma during processing, it may be helpful to close the access port for that processing chamber to prevent stray plasma from damaging the robot in the transfer station. In some embodiments, all of the processing chambers 100 are configured to perform the same process and the access ports are open throughout as each chamber has process stations 110 that isolate the substrate to a process region 111 during processing.

The processing platform 400 of some embodiments is connected to a factory interface 450 to allow substrates or cassettes of substrates to be loaded into the processing platform 400. A robot 455 within the factory interface 450 can be used to move the substrates or cassettes into and out of the buffer stations. The substrates or cassettes can be moved within the processing platform 400 by the robot 430 in the central transfer station 410. In some embodiments, the factory interface 450 is a transfer station of another cluster tool (i.e., another multiple chamber processing platform).

Some embodiments of the processing platform 400 include a controller 490 coupled to various components of the processing platform 400 to control the operation thereof. The controller 490 of some embodiments controls the entire processing platform 400. In some embodiments, the processing platform 400 includes multiple controllers 490; each configured to control one or more individual portions of the processing platform 400. For example, the processing platform 400 of some embodiments comprises separate controllers for one or more of the individual processing chambers 100, central transfer station 410, factory interface 450 and/or robots 430.

While the controller 490 is illustrated in FIG. 4 as connected to and controlling one or more components of the processing platform 400, the controller 490 may also be connected to a single processing chamber 100. For example, although not included in the drawings, a controller 490 in some embodiments is connected to the processing chamber 100 illustrated and described with respect to FIGS. 1 and 2.

In some embodiments, at least one controller 490 is coupled to one or more of the processing chamber 100, substrate support assembly 200, flow controller, pressure gauge, pump, feedback circuit, reaction space pressure gauge, gas distribution assembly 105, robot 430, robot 455 or other component used for the operation of the processing platform 400, as the skilled artisan will understand.

The controller 490 may be one of any form of general-purpose computer processor, microcontroller, microprocessor, etc., that can be used in an industrial setting for controlling various chambers and sub-processors. The at least one controller 490 of some embodiments has a processor 492, a memory 494 coupled to the processor 492, input/output devices 496 coupled to the processor 492, and support circuits 498 to communication between the different electronic components. The memory 494 of some embodiments includes one or more of transitory memory (e.g., random access memory) and non-transitory memory (e.g., storage).

The memory 494, or a computer-readable medium, of the processor may be one or more of readily available memory such as random access memory (RAM), read-only memory (ROM), floppy disk, hard disk, or any other form of digital storage, local or remote. The memory 494 can retain an instruction set that is operable by the processor 492 to control parameters and components of the system. The support circuits 498 are coupled to the processor 492 for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

One or more embodiments of the disclosure advantageously provide simple, reliable mechanisms to transfer wafers into and out of spatial multi-substrate processing tools. Some embodiments incorporate primary lift pins without counter-weights. Some embodiments use electrically conductive materials for the primary lift pins. In some embodiments, the primary lift pins can advantageously be dropped into openings in the pedestal heaters.

The secondary lift pins are positioned to rotate with the support arm 220 so that the secondary lift pins remain associated with the same substrate support throughout.

In some embodiments, both the primary lift pins and secondary lift pins are electrically and/or thermally conductive. The use of conductive materials for the lift pins prevents charge building during processing which can lead to the lift pins sticking. Some embodiments prevent non-uniform chucking of incoming substrates by grounding the substrate until it is fully seated on the substrate support surface 231. Additionally, conductive lift pins ground and discharge electrical charge from the substrate for an outgoing substrate.

Some embodiments include a static lift pin actuation plate. The actuation plate can be located at any suitable position within the processing chamber. In some embodiments, the actuation plate is located adjacent the chamber access port. Some embodiments of the disclosure advantageously remove the need for a separate, active lifting motor for lift pin actuation during wafer transfer. In some embodiments, the combination of lift pins and actuation plate are less intrusive in the process volume, reduce cost and/or decrease substrate transfer times.

Figure 5:
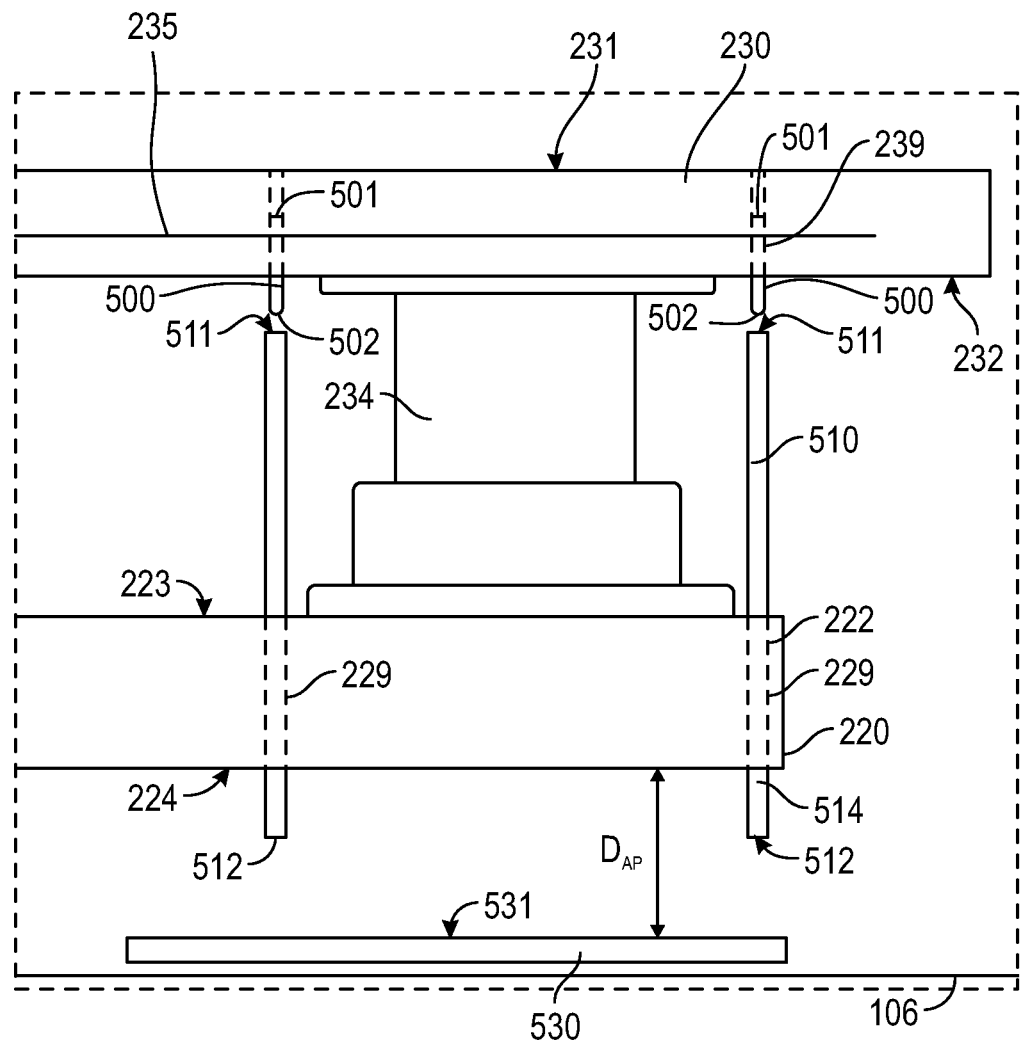
FIG. 5 is a schematic representation of a support assembly in a processing position according to one or more embodiment of the disclosure.
Figure 6:
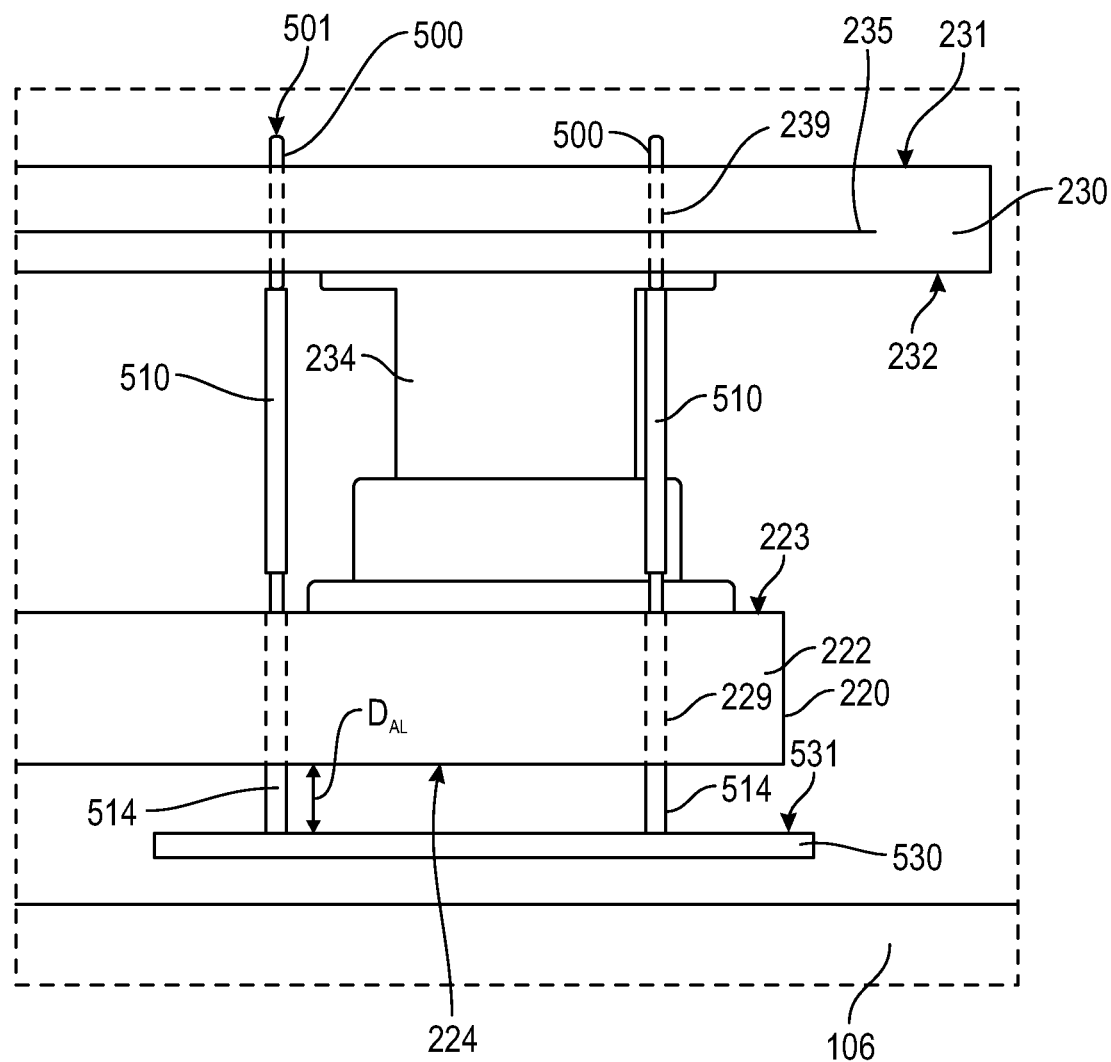
FIG. 6 is a partial schematic view of a support assembly in an exchange position according to one or more embodiment of the disclosure.

With reference to FIGS. 5 through 8, the support assembly 200 is movable along the rotational axis 211 between a processing position (as shown in FIG. 5) to a transfer position (as shown in FIG. 6 through 8). As used in this manner, the term "transfer position" refers to a physical location of the support assembly 200 in which a substrate can be loaded onto and/or unloaded from the support surface 231. The use of "loading" also refers to unloading unless otherwise specified. FIG. 5 shows a partial cross-sectional schematic view of a process chamber with the support assembly 220 in the processing position according to one or more embodiment of the disclosure. FIG. 6 shows a partial cross-sectional schematic view of a process chamber with the support assembly 220 in the transfer position according to one or more embodiment of the disclosure. FIG. 7 shows a partial cross-sectional orthoscopic view of the process chamber of FIG. 6. FIG. 8 shows a partial orthoscopic view of a portion of the process chamber of FIG. 7 at a different viewing angle.

The support assembly 200 of some embodiments is rotated around the rotational axis 211 using a rotation motor 260 connected to the rotatable base 210. In some embodiments, the support assembly 200 is movable along the length of the rotational axis 211 (in the Z-axis direction) using a lift motor 265.

Some embodiments of the disclosure incorporate at least three primary lift pins 500 positioned within openings 239 in each of the substrate supports 230. The openings 239 pass through the entire thickness of the substrate support 230 allowing the primary lift pins 500 to be dropped into the openings 239 through the support surfaces 231 and easily removed. The number of primary lift pins 500 can be varied and is not limited to three. In some embodiments, there are more or less than three primary lift pins 500. In some embodiments, there are at least four, five or six primary lift pins 500.

Figure 9A:
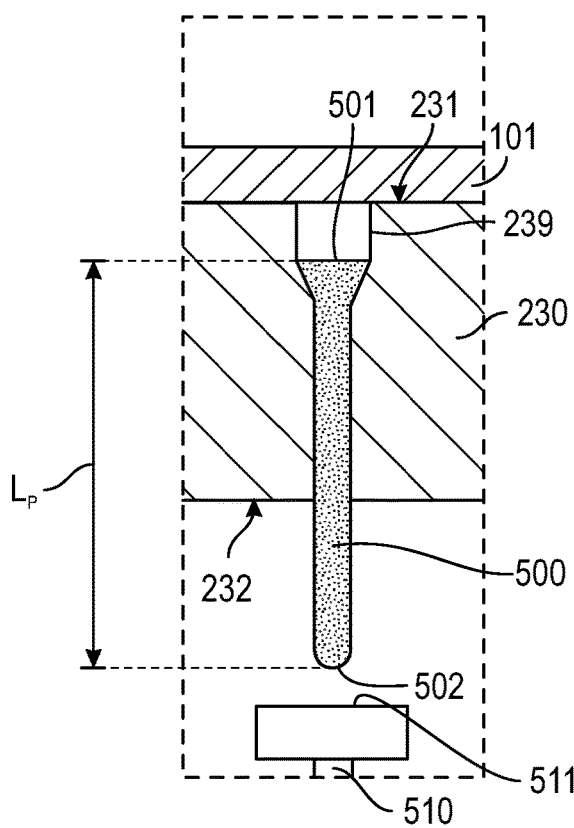
FIG. 9A is a partial schematic view of a primary lift pin and a secondary lift pin in a processing position according to one or more embodiment of the disclosure.
Figure 9B:
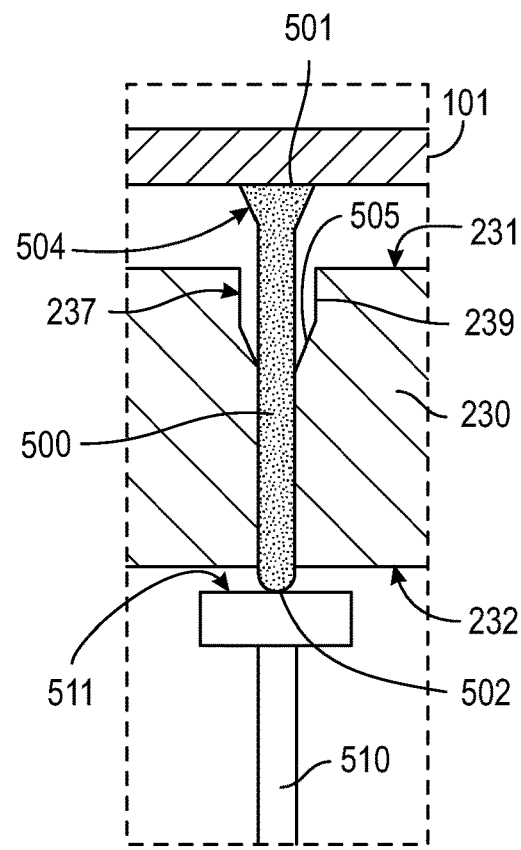
FIG. 9B is a partial schematic view of a primary lift pin and a secondary lift pin in an exchange position according to one or more embodiment of the disclosure.

Each of the primary lift pins 500 has a top end 501 and a bottom end 502 defining a length $L_P$ of the primary lift pin 500. FIG. 9A illustrates an expanded view of a primary lift pin 500 in the opening 239 in the substrate support 230 in the processing position. The primary lift pins 500 and openings 239 of some embodiments are configured to cooperatively interact to prevent the primary lift pins 500 from passing fully through the bottom surface 232 of the substrate support 230. FIG. 9B illustrates an expanded view of the primary lift pin 500 of FIG. 9A in the opening 239 of the substrate support 230 in the transfer position. The top end portion 504 of the primary lift pin 500 illustrated has a flared shape that interacts with a complementary flared shape 237 along the length of the opening 239. In some embodiments, as shown in FIG. 9A, the complementary flared shape 237 in the opening 239 is positioned within the thickness of the substrate support 230 sufficient so that when in the processing position, the top end 501 of the primary lift pin 500 is recessed below the support surface 231. In some embodiments, when the process chamber is in the process position, the top end 501 of the primary lift pins 500 are substantially coplanar with or below the support surface 231 of the substrate support 230.

In some embodiments, the top end portion 504 of the primary lift pins 500 are flared and the openings 239 in the substrate supports 230 have a complementary flared surface 505 to prevent the length of the primary lift pin 500 from passing through the bottom surface 232 of the substrate support 230.

While the top end portion 504 of the primary lift pin 500 is illustrated with a conical flare, the skilled artisan will recognize that this is merely one possible configuration and that the top end of the primary lift pin 500 can have any suitable shape. The complementary shape formed in the opening 239 of some embodiments mimics the shape of the top end portion 504. In some embodiments, the opening 239 has some irregularity that cooperatively interacts with the primary lift pin 500 to prevent the primary lift pin 500 from falling out of the substrate support 230.

The bottom end 502 of the primary lift pins 500 in some embodiments is rounded. As will be further described, a rounded bottom end 502 may help minimize or eliminate sideway directed load during interaction with the secondary lift pins 510.

The length LP of the primary lift pins 500 can be varied. In some embodiments, the length LP of the primary lift pins 500 is greater than the thickness of the substrate support 230 so that a portion of the primary lift pin 500 can be above the support surface 231 and a portion of the primary lift pin 500 can be below the bottom surface 232 of the substrate support 230 at any given time. This is illustrated in 9B. The length LP of the primary lift pin 500 in some embodiments is minimized to prevent wobbling of the primary lift pins 500 within the opening 239.

In some embodiments, the primary lift pins 500 and openings 239 are configured to prevent tilting of the primary lift pins 500 within the openings 239. The size of the primary lift pin 500 and/or opening 239 are different so that a gap is formed between the pin and opening. The size of the gap—also referred to as the tolerance—is sufficiently small to prevent tilting. In some embodiments, primary lift pins 500 and openings 239 in the substrate support 230 are configured to have a maximum tilt relative to a line normal to the plane of the pedestal face of 0.33°.

The primary lift pins 500 can be made out of any suitable material. In some embodiments, the primary lift pins 500 are made of a thermally and/or electrically conductive material. In some embodiments, the primary lift pins 500 comprise one or more of aluminum nitride, aluminum oxide, stainless steel, stainless steel coated with aluminum oxide or silicon carbide. In some embodiments the primary lift pins 500 have no auxiliary weight to prevent wobble of the primary lift pins 500.

Figure 10A:
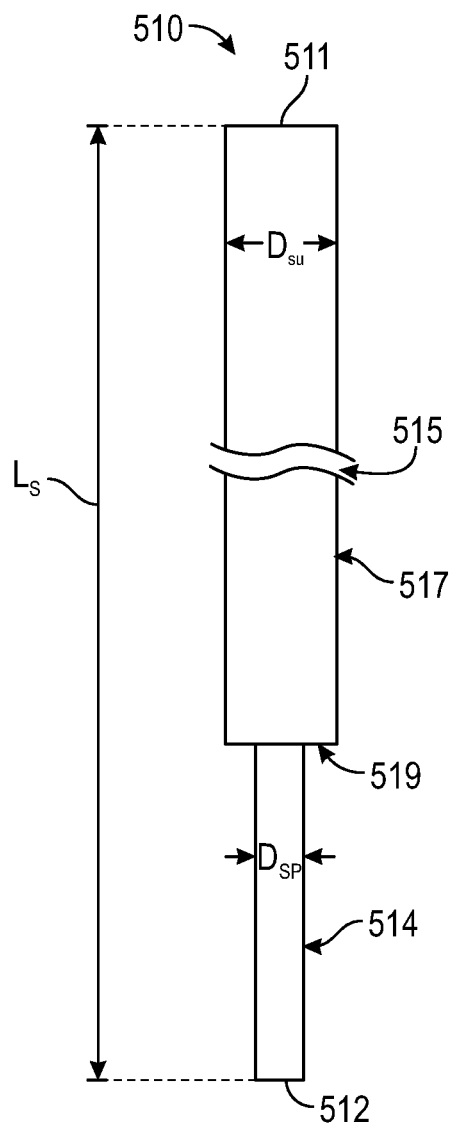
FIGS. 10A and 10B illustrate secondary lift pins according to one or more embodiment of the disclosure.
Figure 10B:
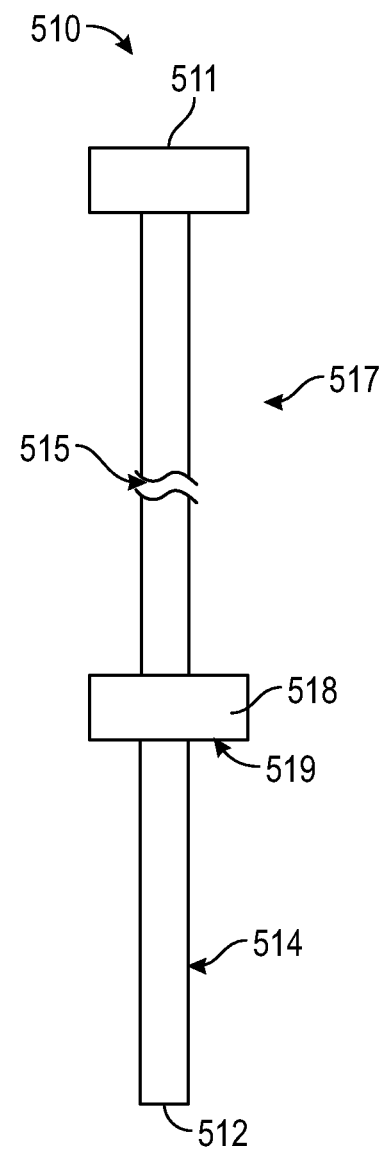

Referring back to FIGS. 5 through 8, some embodiments include at least three secondary lift pins 510. The secondary lift pins 510 are positioned within openings 229 in the support arms 220. Each of the secondary lift pins 510 have a top end 511 and a bottom end 512 defining a length $L_S$. FIGS. 10A and 10B illustrate two possible secondary lift pins 510. The secondary lift pins 510 illustrated in FIGS. 10A and 10B are merely representative of possible configurations and should not be taken as limiting the scope of the disclosure. The illustrated embodiments include a symbolic break 515 to indicate that the length $L_S$ of the secondary lift pins 510 can vary.

At least some of the secondary lift pins 510 are aligned with the primary lift pins 500. In some embodiments, there is the same number of secondary lift pins 510 as primary lift pins 500. In some embodiments, each of the secondary lift pins 510 is aligned with a primary lift pin 500. The number of primary lift pins 500 and secondary lift pins 510 can be varied so long as sufficient interaction between the lift pins can be generated to allow for loading and unloading of substrates.

Figure 11A:
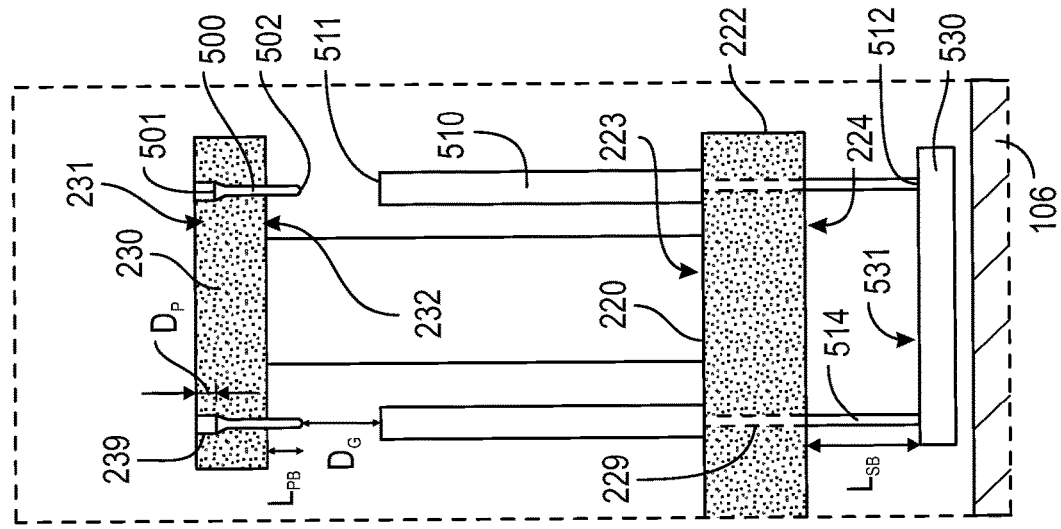

The secondary lift pins 510 are positioned within openings 229 at the outer end 222 of the support arm 220. At least a portion 514 of the bottom end 512 (or the region near the bottom end 512) extends from the bottom surface 224 of the support arm 220. Referring to FIG. 11A, the length $L_{SB}$ of the portion 514 of the secondary lift pin 510 that extends below the bottom surface 224 of the support arm 220 is at least equal to the distance $D_G$ between the top end 511 of the secondary lift pin 510 and the bottom end 502 and the distance $D_P$ between the top end 501 of the primary lift pin 500 and the top surface 231 of the substrate support 230. In some embodiments, the distance $D_A$ from the bottom end 512 of the secondary lift pin 510 to the actuation surface 531 of the actuation plate 530 is greater than or equal to the distance $D_G$ between the top end 511 of the secondary lift pin 510 and the bottom end 502 and the distance $D_P$ between the top end 501 of the primary lift pin 500 and the top surface 231 of the substrate support 230.

The secondary lift pins 510 and openings 229 in the support arms 220 are configured to cooperatively interact to prevent the secondary lift pins 510 from passing fully through the bottom surface 224 of the support arms 220.

In some embodiments, the top end 511 of the secondary lift pins 510 is flat. In some embodiments, the bottom end 502 of the primary lift pins 500 is rounded and the top end 511 of the secondary lift pins 510 is flat. The combination of flat and rounded surfaces of the primary and secondary lift pins help to alleviate sideways directed load as a result of slight misalignment. In some embodiments, the bottom end 502 of the primary lift pins 500 is flat and the top end 511 of the secondary lift pins 510 is rounded.

The opening 229 in the support arms 220 can be any suitable size to allow the secondary lift pins 510 to move along the Z-axis direction. In some embodiments, the opening 229 in the support arms 220 is sized within 0.01 inches, 0.0075 inches or 0.005 inches of the diameter $D_{SP}$ of the lower end portion 514 of the secondary lift pin 510.

In some embodiments, the secondary lift pins 510 and openings 229 in the support arms 220 are configured to prevent the secondary lift pins 510 from tilting greater than 0.33° during movement of the support assembly. The angle of the tilt is measured relative to the top surface 223 of the support arm 220 with 0° being normal to the top surface 223.

The secondary lift pins 510 can be made of any suitable material. In some embodiments, the secondary lift pins 510 comprise one or more of stainless steel or titanium.

FIG. 10A shows an embodiment of a secondary lift pin 510. The secondary lift pin shown has a stepped diameter along the length LS so that an upper portion 517 has a larger diameter $D_{SU}$ than the diameter $D_{SP}$ of the lower portion 514. The intersection of the upper portion 517 and the lower portion 514 results in a transition from the smaller diameter to the larger diameter. The transition can be abrupt like the step shown in FIG. 10A, or can be gradual like the flared top of the primary lift pin. In some embodiments, the transition forms a contact surface 519. The contact surface 519 is configured to contact the top surface 223 of the support arm 220 when the process chamber is in the process position.

FIG. 10B shows another embodiment of a secondary lift pin 510. In this embodiment, the secondary lift pin 510 has a bushing 518 positioned along the length LS of the lift pin 510. The bushing 518 has a bottom surface that acts in the same manner as the contact surface 519 of FIG. 10A. The bushing 518 is configured to contact the top surface 223 of the support arm 220 and to prevent the secondary lift pin 510 from moving beyond the process position toward the actuator plate 530. The bushing 518 of some embodiments is movable along the length of the secondary lift pin 510 so that the length of the bottom portion 514 can be adjusted.

Referring again to FIGS. 5 through 8, the process chamber 100 includes an actuation plate 530. The actuation plate 530 has an actuation surface 531 configured to engage the bottom end 512 of the secondary lift pins 510. The actuation plate 530 is spaced a distance from the rotational axis 211 to align with the outer end 222 of the support arm 220. In some embodiments, there is one actuation plate 530.

The actuation plate 530 can be any suitable shape. In the illustrated embodiment, the actuation plate 530 forms a portion of a ring. The actuation plate 530 size is sufficient when all of the secondary lift pins 510 at the end of one of the support arms 220 can be engaged with the actuation surface 531 at the same time.

The actuation surface 531 of the actuation plate 530 is positioned a distance $D_{AP}$ from the bottom surface 224 of the support arm 220 along the Z-axis when the process chamber is in the process position, as shown in FIGS. 5 and 11A. When the support assembly 200 is in the process position, the bottom end 502 of the primary lift pins 500 extend a process distance (length $L_{PB}$) from the bottom surface 232 of the substrate support 230. The bottom end 502 of the primary lift pins 500 are spaced a distance $D_G$ from the top end 511 of the secondary lift pins 510. The bottom end 512 of the secondary lift pins 510 extends a process distance (length $L_{SP}$) from the bottom surface 224 of the support arms 220. When the support arm 220 is adjacent the actuation plate 530, the bottom end 512 of the secondary lift pins 510 are a process distance $D_A$ from the actuation surface 531. As used in this manner, the support arm 220 is adjacent the actuation plate 530 when the support arm 220 is in alignment along the Z-axis sufficient that the actuation surface 531 can engage the secondary lift pins 510.

Referring to FIGS. 11A through 11D, a portion of a processing method in accordance with one or more embodiment of the disclosure is described. In FIG. 11A, support assembly 200 within the processing chamber 100 has been rotated to align the outer end 222 of the support arm 220 with the actuation plate 530.

Figure 11B:
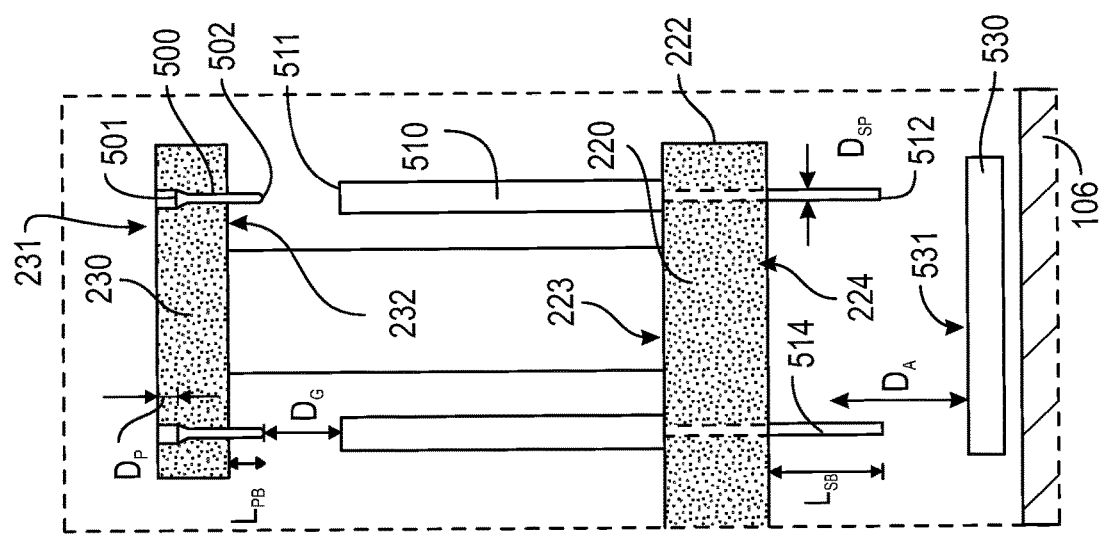

FIG. 11B shows the embodiment of FIG. 11A after the support assembly 200 is moved along the rotational axis 211 toward the actuation plate 530. The bottom surface 512 of the secondary lift pins 510 passing through the thickness of the support arm 220 contacts the actuation surface 531 of the actuation plate 530. At this point in the process, the distance $D_A$ between the bottom end 512 of the secondary lift pin 510 and the actuation surface 531 of the actuation plate 530 is zero. The length $L_{SB}$ of the lower portion 514 of the secondary lift pin 510 remains the same until contact between the secondary lift pin 510 and the actuation plate 530 occurs.

FIG. 11C shows the embodiment of FIG. 11B after the support assembly 200 is moved further along the rotational axis 211 toward the actuation plate 530. The contact between the actuation surface 531 and the bottom end 512 of the secondary lift pins 510 causes the secondary lift pins 510 to remain in place relative to the actuation surface 531. The support arm 220 continues moving toward the actuation plate and the lower portion 514 of the secondary lift pins 510 slides through opening 229 in the support arm 220 decreasing the length $L_{SB}$ of the lower portion 514 of the secondary lift pin 510 below the bottom surface 224 of the support arm.

The substrate support 230 and primary lift pins 500 also continue moving along the Z-axis toward the actuation plate 530. The bottom end 502 of the primary lift pin 500 contacts the top end 511 of the secondary lift pin 510. At this point, the distance $D_G$ has decreased to zero and the lower portion 516 of the secondary lift pin 510 above the top surface 223 of the support arm 220 increases to a distance $D_{GL}$. The distance $D_{GL}$, at the point in time shown in FIG. 11C, is the same as the distance $D_G$ at the point in time shown in FIG. 11B. The length $L_{BP}$ that the primary lift pin 500 extends below the bottom surface 232 of the substrate support 230 remains the same as that of FIG. 11B.

FIG. 11D shows the embodiment of FIG. 11C after the support assembly 200 is moved to the transfer position, as shown in FIG. 6. When in the transfer position, the actuation surface 531 of the actuation plate 530 is positioned a loading distance $D_{AL}$ from the bottom surface 224 of the support arm 220 along the Z-axis. The bottom surface 224 of the support arm 220 is spaced a loading distance $D_{AL}$ from the actuation surface 531 of the actuation plate 530. The bottom ends 512 of the secondary lift pins 510 are in contact with the actuation surface 531 and the length of the lower portion 514 of the secondary lift pins 510 extending from the bottom surface 224 is at a minimum length $L_{SBL}$. The top ends 511 of the secondary lift pins 510 are in contact with the bottom ends 502 of the primary lift pins 500 and the top end 501 of the primary lift pins 500 extend a loading distance $D_{PL}$ from the support surface 231 of the substrate support 230. The length $L_{PB}$ of the primary lift pin 500 extending out of the bottom surface 232 of the substrate support 230 is at a minimum length. FIG. 9B shows an expanded view of the primary lift pin 500 in the transfer position and supporting a substrate 101. Some embodiments further comprise performing the operations described with respect to FIGS. 11A through 11D in reverse.

Figure 12:
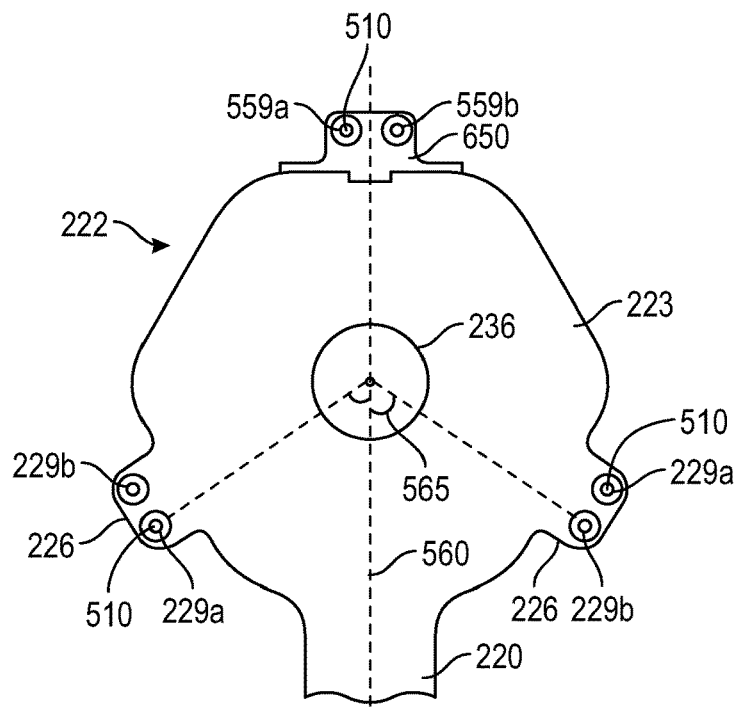
FIG. 12 is a top view of an outer end of a support arm according to one or more embodiment of the disclosure.
Figure 13:
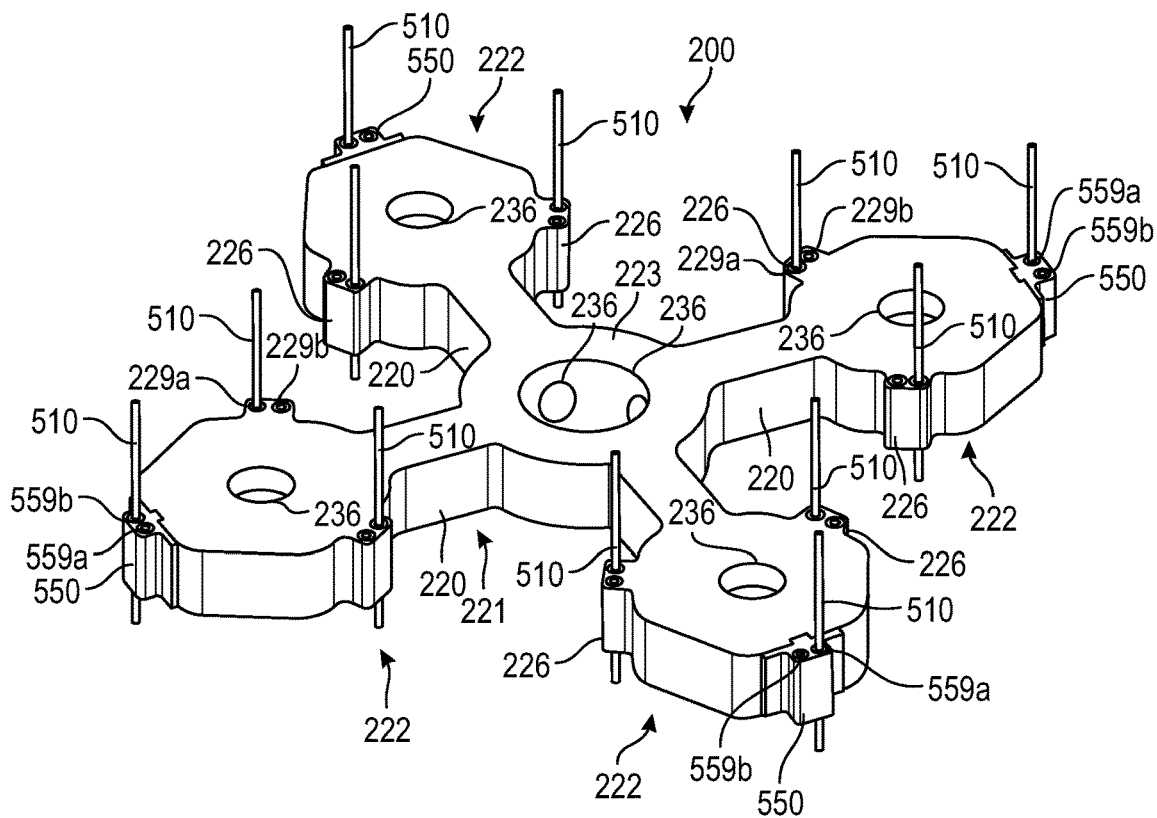
FIG. 13 is an isometric view of a support assembly according to one or more embodiment of the disclosure.
Figure 14:
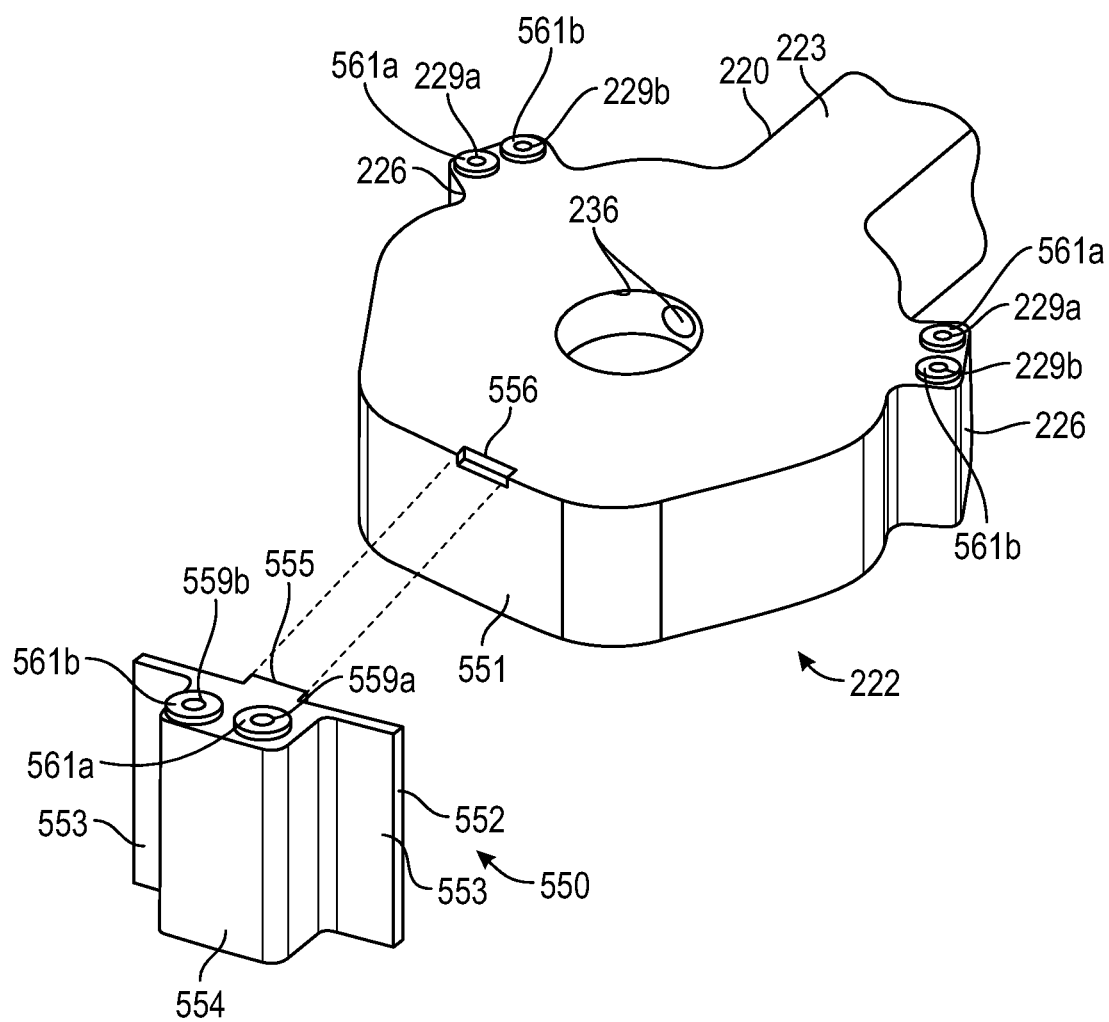
FIG. 14 is an exploded partial isometric view of an outer end of a support arm with removable block according to one or more embodiment of the disclosure.

FIGS. 12 through 14 illustrate a support arm 220 in accordance with one or more embodiment of the disclosure. FIG. 12 shows an expanded partial view of an outer end 222 of a support arm 220 looking at the top surface 223. FIG. 13 shows an orthogonal view of a support arm 220 with the outer end 222 of FIG. 12. FIG. 14 shows an exploded view of the outer end 222 of the partial support arm 220 shown in FIG. 12 and FIG. 13.

The outer end 222 of the support arm 220 illustrated has three secondary lift pins 510 spaced around an outer peripheral portion of the outer end 222. Two of the secondary lift pins 510 are located in protrusions 226 that extend from a central part of the outer end 222. The protrusions 226 of some embodiments are integrally formed with the support arm 220.

Each of the protrusions 226 includes a pair of openings 229a, 229b that extend through the thickness of the support arm 220. Only one of the pair of openings 229a, 229b has a secondary lift pin 510 located therein. In the illustrated embodiment, each of the openings 229a has a secondary lift pin 510 and each of the openings 229b is unoccupied. In some embodiments, each of the openings 229b has a secondary lift pin 510 and each of the openings 229a is unoccupied. In some embodiments of a processing tool containing multiple processing chambers 100, one of the processing chambers 100 has the secondary lift pins 510 in one of the openings 229a, 229b, and another process chamber 100 is a mirror image with the secondary lift pins 510 in the other of the openings 229a, 229b.

In the embodiment illustrated in FIGS. 12 to 14, two protrusions 226 exist on the outer end 222 of each support arm 220, accounting for two of the secondary lift pins 510. A third secondary lift pin 510 is positioned within a removable block 550 that connects to the outer face 551 of the support arm 220. For example, in an embodiment in which a channel 236 is drilled through the body of the support arm 220 from the outer face 551 toward the center base 210, there is no protrusion on the outer face 551. A removable block 550 in some embodiments is attached to the outer face 551 after drilling. In some embodiments, the removable block 550 seals the open end of the drilled channel 236. In some embodiments, the open end of the drilled channel is covered by a separate cover piece (not shown) and the removable block 550 is attached to the outer face 551 through, over or around the separate cover piece.

The removable block 550 includes a body 552 with at least one connection flange 553 and a protrusion 554. The illustrated removable block 550 has two connection flanges 553 on either side of the protrusion 554. The removable block 550 includes two openings 559a, 559b for holding a secondary lift pin 510. The spacing between the openings 559a, 559b of some embodiments is the same as the spacing between openings 229a, 229b on the protrusion 226 of the outer end 222 of the support arm 220.

In the illustrated embodiment, the body 552 of the removable block 550 includes an indexing tab 555. The indexing tab 555 extends from the body 552 in a direction opposite the protrusion 554. The indexing tab 555 of some embodiments is sized to cooperatively interact with a detent 556 formed in the outer end 222 of the support arm 220. In the embodiment shown, the detent 556 is a notch removed from the intersection of the outer face 551 and the top surface 223 of the support arm. In some embodiments, there is more than one indexing tab 555 on the removable block 550 and there is more than one detent 556 on the outer end 222 of the support arm 220. The indexing tab 555 and detent 556 aids in alignment of the removable block 550 on the outer end 222 of the support arm 220 so that the locations and angular relationships of the secondary lift pins 510 can be maintained.

In some embodiments, the process chamber 100 comprises at least one removable secondary lift pin block 550 connected to the outer end 222 (or outer face 551) of the support arm 220. The removable secondary lift pin block 550 of some embodiments has at least one opening configured to support one of the secondary lift pins 510. In some embodiments, the removable secondary lift pin block 550 comprises two openings 559a, 559b configured to engage a secondary lift pin 510 and one of the openings is not used, or remains open.

In the embodiment of FIG. 8, the secondary lift pins 510 are arranged in a triangular pattern with one of the secondary lift pins 550 aligned along a central axis 560 (see FIG. 12) of the support arm 220. The dual openings 229a, 229b, 559a, 559b of FIGS. 12 to 14 shift the angle of the triangular pattern so that the openings 559a, 559b at the outer end 222 are no longer aligned with the central axis 560. Using each of the 'a' location openings 229a, 559a, or the 'b' location openings 229b, 559b, results in the triangular pattern rotated around a center of the triangle by an amount.

Figure 15:
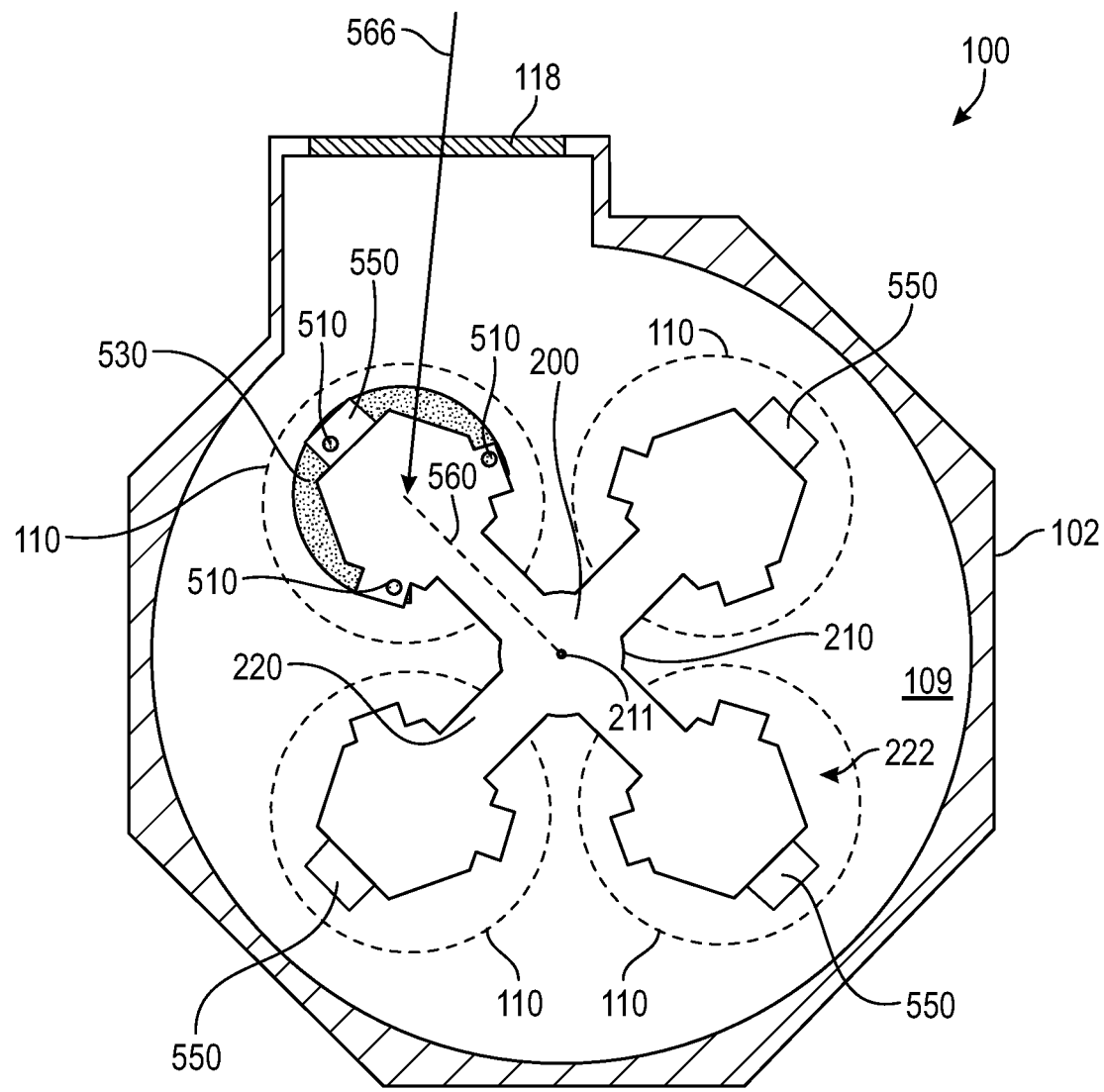
FIG. 15 is a schematic view of a processing chamber according to one or more embodiment of the disclosure.

FIG. 15 shows a schematic view of a processing chamber 100 in accordance with one or more embodiment of the disclosure. The illustrated embodiment has four process stations 110 arranged around the interior volume 109. The support assembly 200 is rotated to a position so that each of the outer ends 22 of the support arms 220 are adjacent a process station 110. The secondary lift pins 510 are illustrated on the top left process station 110; which is the station 110 closest to the access port 118.

Figure 17:
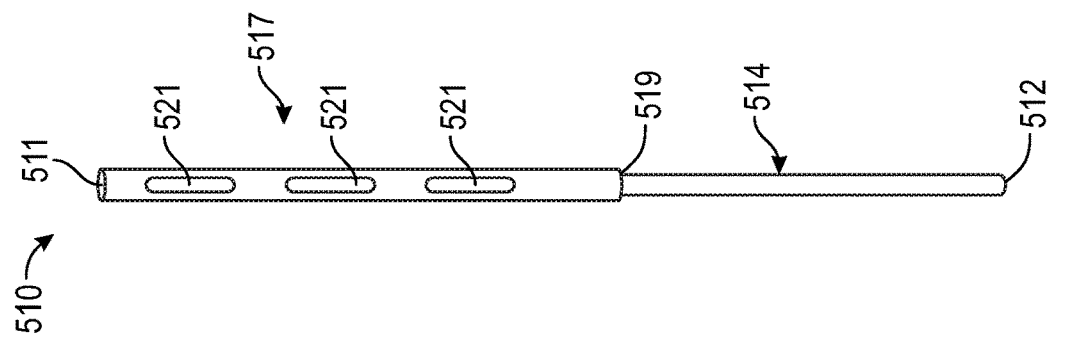
FIG. 17 is a front view of a lift pin according to one or more embodiment of the disclosure.
Figure 16B:
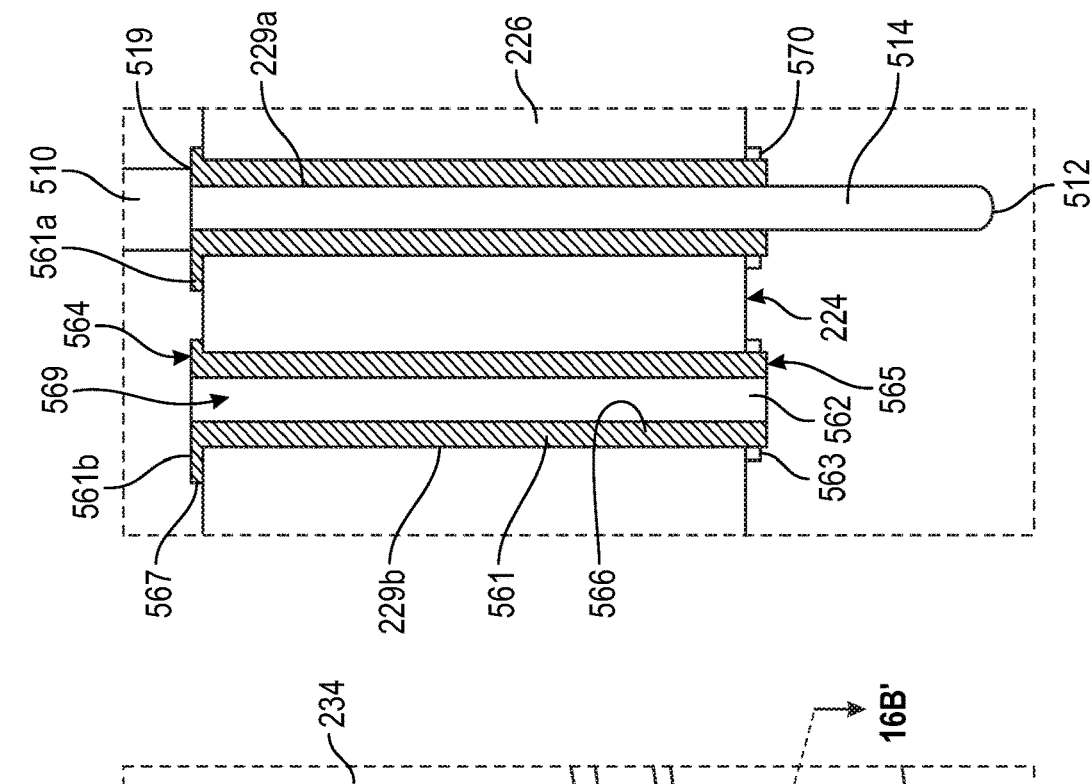
FIG. 16B is a cross-sectional view of the embodiment of FIG. 16A taken along line 16B-16B'.
Figure 16A:
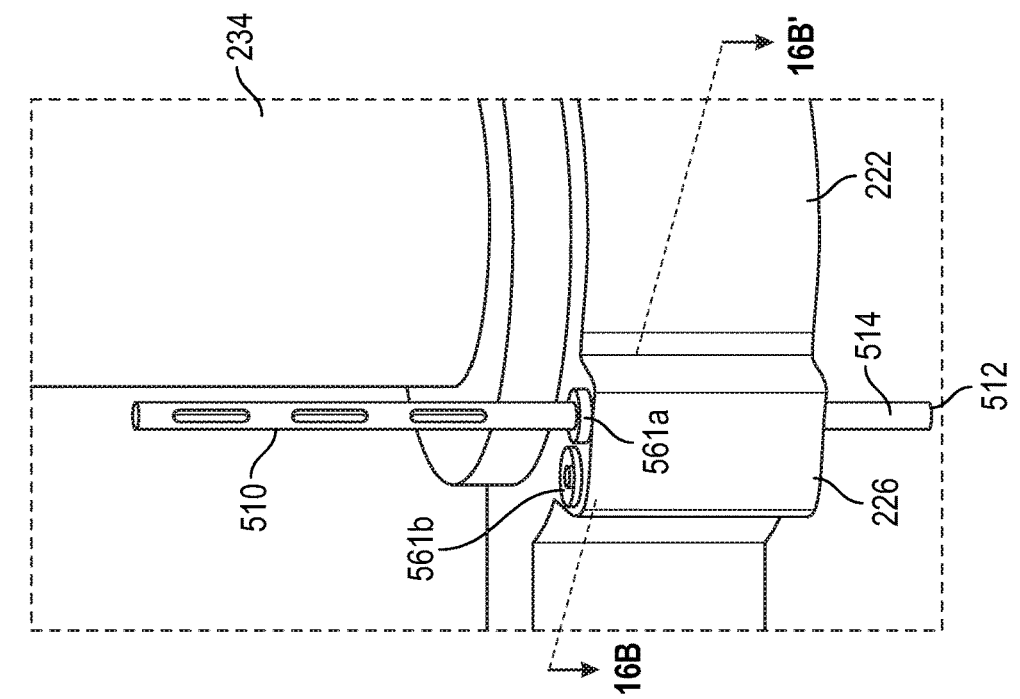
FIG. 16A is partial isometric view of an outer end of a support arm with lift pin according to one or more embodiment of the disclosure.

FIGS. 16A, 16B and 17 illustrate one or more embodiments of the disclosure in which a secondary lift pin 510 is positioned within a bushing 561a located in opening 229a. Opening 229b has a bushing 561b that has an opening 562 without a secondary lift pin 510. In some embodiments, there bushing 561b without a secondary lift pin 510 is omitted.

FIG. 16A shows an orthoscopic view of a portion of the outer end 222 of a support arm 220. FIG. 16B shows a cross-sectional view of the protrusion 226 illustrated in FIG. 16A taken along line 16B-16B'. The bushing 561, which can be either bushing 561a or 561b, of some embodiments is a cylindrical component within inner face 562 and an outer face 563 defining a thickness of the wall 566 of the bushing 561. The bushing 561 has a top end 564 and a bottom end 565 defining a length of the bushing 561. The top end 564 of some embodiments has a flange 567 with an outer diameter that is greater than the outer diameter of the wall 566 to prevent the bushing 561 from falling through the opening 229b. An opening 569 extends from the top end 564 to the bottom end 565 of the bushing 561 which the secondary lift pin 510 can be positioned within.

The bushing 561 can be made of any suitable material known to the skilled artisan. Suitable materials include, but are not limited to, polyethylene terephthalate (PET), acrylic, polycarbonate, acrylic polycarbonate, polystyrene, cross-linked polystyrene (e.g., Rexolite®), polyetherimides (PEI) and polyvinylidene fluoride (PVDF). In some embodiments, the bushing 561 is made of polyether ether ketone (PEEK).

The inner diameter of the opening 569 of some embodiments is configured to cooperatively interact with the outer diameter of the lower portion 514 of the secondary lift pin 510 to prevent or minimize tilting. In some embodiments, the inner diameter of the bushing 561 is in the range of 3.0 mm to 9.0 mm, or in the range of 4.0 mm to 8.0 mm, or in the range of 5.0 mm to 7.0 mm, or in the range of 5.5 mm to 6.5 mm. In some embodiments, the outer diameter of the portion 514 of the secondary lift pin 510 is in the range of 2.5 mm to 8.5 mm, or in the range of 3.5 mm to 7.5 mm, or in the range of 4.5 mm to 6.5 mm, or in the range of 5.0 mm to 6.0 mm. In some embodiments, In some embodiments, the inner diameter of the of the bushing 561 is greater than the outer diameter of the secondary lift pin 510 lower portion 514 by greater than or equal to 0.1 mm, 0.2 mm, 0.3 mm, 0.4 mm, 0.5 mm, 0.6 mm, 0.7 mm, 0.8 mm, 0.9 mm or 1.0 mm. In some embodiments, the inner diameter of the bushing 561 is greater than the outer diameter of the secondary lift pin 510 lower portion 514 by less than 1.2 mm, 1.0 mm, 0.9 mm, 0.8 mm, 0.7 mm, 0.6 mm, 0.5 mm, 0.4 mm or 0.3 mm.

In some embodiments, the bushing 561 has a length from the top end 564 to the bottom end 565 that is greater than the thickness of the protrusion 226 or support arm 220. An embodiment of this sort is illustrated in FIG. 16B. The portion of the bottom of the bushing that extends from the bottom surface 224 of the support arm 220 in some embodiments has a locking pin 570 to prevent accidental lifting of the bushing 561.

In some embodiments, the secondary lift pins 510 include one or more weight-reducing cut-out to lower the center of gravity. In some embodiments, the center of gravity is lowered while maintaining overall rigidity of the secondary lift pin 510. In some embodiments, the secondary lift pins 510 with lower center of gravity reduce vibration and rubbing between the secondary lift pin 510 and a bushing 561a, 561b located within the openings 229a, 229b, respectively.

Some embodiments of the disclosure provide apparatus in which the lifespan of the bushing 561 is increased. Without being bound by theory, it is believed that the lower center of gravity and/or the lower overall mass prevents the secondary lift pin 510 from wobbling or tilting as much as without the cut-outs so that there is less rubbing against the bushing, which extends the lifespan of the PEEK bushing which is a consumable part, lengthening the time between routine maintenance. In some embodiments, the reduced mass of the lift pin creates less friction between the lift pin and the bushing. In some embodiments, lowering the center of gravity of the secondary lift pin allowed for an increase in the travel distance along the Z-axis direction without the pin being as likely to lean to one side or the other while moving.

In some embodiments, the secondary lift pin 510 has a lowered center of gravity and maintains sufficient structural integrity to prevent bending of the pin. Attempts at lowering the center of gravity proved challenging as the resulting pins became flimsy and easily bent.

Referring to FIG. 17, some embodiments of the disclosure are directed to secondary lift pins 510 with one or more cut-outs 521 along the length of the secondary lift pin 510. In some embodiments, the cut-outs 521 are within the upper portion 517 of the secondary lift pin 510 and not in the lower portion 514. In some embodiments, the cut-outs are elongate slots along the length of the secondary lift pin 510 that reduce the overall weight of the secondary lift pin 510.

The embodiment illustrated in FIG. 17 includes three cut-outs 521. The skilled artisan will recognize that this is merely representative of one possible configuration and that other configurations are within the scope of the disclosure. The number of cut-outs 521 can be varied depending on, for example, the overall length of the lift pin, the overall weight of the lift pin, the amount of weight to be removed from the lift pin and/or the amount that the center of gravity is to be lowered. In some embodiments, there are one, two, three, four, five, six, seven, eight, nine, ten or more cut-outs 521.

In some embodiments, the cut-outs reduce the weight of the secondary lift pin by an amount greater than or equal to 0.01 lbs, 0.02 lbs, 0.03 lbs, 0.04 lbs, 0.05 lbs, 0.06 lbs, 0.07 lbs or 0.08 lbs.

In some embodiments, the cut-outs are configured to lower the center of gravity of the secondary lift pin 510 by greater than or equal to 3 mm, 4 mm, 5 mm, 6 mm, 7 mm, 8 mm, 9 mm, 10 mm, 11 mm or 12 mm. In some embodiments, the cut-outs are configured to lower the center of gravity of the secondary lift pin 510 by less than or equal to 20 mm, 18 mm, 16 mm, 14 mm or 12 mm.

Additionally, in this embodiment, the station closest to the access port 118 is the only station adjacent the actuation plate 530. The illustrated orientation is that of the transfer position. In some embodiments, when the support assembly 200 is in the transfer position, only one of the support arms 220 is positioned over the actuation plate 530 and movement of the support assembly 200 along the rotational axis 211 actuates the secondary lift pins 510 in only the support arm 220 positioned over the actuation plate 530. In some embodiments, the actuation plate 530 is aligned with one of the process stations 110 so that a substrate is loaded and/or unloaded directly onto a substrate support 230 aligned with a process station 110.

During transfer of the substrate into and/or out of the process chamber 100, the access port 118 opens and a robot arm enters the interior volume 109. In some embodiments, a substrate is moved 556 through the access port 118 and onto the primary lift pins 500 at an angle relative to the central axis 560 of the support arm 220. In some embodiments, the angle 565 is in the range of 50° to 60°.

Referring again to FIG. 4, some embodiments of the disclosure are directed to processing platforms 400 incorporating the processing chamber 100 as described herein. In some embodiments, the processing platform 400 comprises at least two processing chambers 100 as described herein arranged on opposite sides of the central transfer station 410. In some embodiments, the processing chambers 100 are opposite arrangements so that one of the processing chambers 100 uses the openings 229a, 559a in the support arm 220, and the other processing chamber 100 uses the openings 229b, 559b in the support arm 220.

Some embodiments of the disclosure are directed to controllers 490 having one or more configurations to execute individual processes or sub-processes to perform embodiments of the method described herein. The controller 490 can be connected to and configured to operate intermediate components to perform the functions of the methods. For example, the controller 490 of some embodiments is connected to (directly or indirectly) and configured to control one or more of gas valves, actuators, motors, access ports, vacuum control, etc. Some embodiments are directed to non-transitory computer readable medium configured to execute embodiments of the method.

In some embodiments, the controller 490, or non-transitory computer readable medium, has one or more configurations or instructions selected from: a configuration to move a substrate on a robot to the primary lift pins; a configuration to load and/or unload substrates from the system; a configuration to rotate the support assembly around a rotational axis to align an outer end of a support arm with an actuation plate; a configuration to move the support assembly along the rotational axis toward the actuation plate; a configuration to move the support assembly along the rotational axis away from the actuation plate; a configuration to control the electrostatic chuck and/or electrode within the support body; and/or a configuration to control the thermal element to control the temperature of the substrate support.

In some embodiments, a non-transitory computer readable medium includes instructions, that, when executed by a controller of a processing chamber, causes the processing chamber to perform operations of: rotating a support assembly around a rotational axis to align an outer end of a substrate support arm of the support assembly with an actuation plate; moving the support assembly along the rotational axis, toward the actuation plate so that a bottom end of a plurality of secondary lift pins contact the actuation plate, the secondary lift pins having a length defined by a top end and the bottom end, the secondary lift pins passing through a thickness of the support arm, and cause the top ends of the secondary lift pins to contact bottom ends of primary lift pins and push the primary lift pins so that a top end of the primary lift pins extends from a top surface of a substrate support on top of a support shaft connected to the outer end of the support assembly; open a access port in a side of the processing chamber; and loading a substrate into the processing chamber onto the top end of the primary lift pins.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A process chamber comprising:
   a support assembly comprising:
      a rotatable center base defining a rotational axis, the rotatable center base movable along the rotational axis;
      at least two support arms extending from the center base, each of the support arms having an inner end in contact with the center base, a top surface and a bottom surface defining a thickness of the support arms;
      a support shaft at an outer end of each of the support arms;
      a substrate support on each of the support shafts, the substrate support having a support surface and bottom surface defining a thickness of the substrate support, the bottom surface spaced a distance from the top surface of the support arm;
      at least three primary lift pins positioned within openings in each of the substrate supports, each of the primary lift pins having a top end and a bottom end defining a length of the primary lift pin, at least a portion of the bottom end extending from the bottom surface of the substrate support, the primary lift pins and openings configured to cooperatively interact to prevent the primary lift pins from passing fully through the bottom surface of the substrate support;
      at least three secondary lift pins positioned within openings in the support arms, the secondary lift pins aligned with the primary lift pins, each of the secondary lift pins having a top end and a bottom end defining a length, at least a portion of the bottom end extending from the bottom surface of the support arm, the secondary lift pins and openings in the support arms configured to cooperatively interact to prevent the secondary lift pins from passing fully through the bottom surface of the support arms; and
   an actuation plate positioned a distance from the rotational axis to align with the outer end of the support arms, the actuation plate having an actuation surface spaced a distance from the bottom surface of the support arm and the bottom surface of the secondary lift-pins,
   wherein the support assembly is movable between a process position in which there is a space between the bottom ends of the primary lift pins and the top ends of the secondary lift pins, and a transfer position in which one of the support arms is aligned with the actuation plate and the bottom end of the primary lift pins are in direct contact with the top ends of the secondary lift pins,
   and, in the transfer position, the primary lift pins are extended above a top surface of the substate support by movement of the support assembly along the rotation axis toward the actuation plate to lift the secondary lift pins and the primary lift pins.

2. The process chamber of claim 1, wherein the support assembly is movable along the rotational axis between the process position and the transfer position.

3. The process chamber of claim 2, wherein when the support assembly is in the process position, the bottom end of the primary lift pins extend a process distance from the bottom surface of the substrate support and are spaced a distance from the top end of the secondary lift pins, the bottom end of the secondary lift pins extending a process distance from the bottom surface of the support arms, and when adjacent the actuation plate, the bottom end of the secondary lift pins are a process distance from the actuation surface.

4. The process chamber of claim 2, wherein when the support assembly is in the transfer position, the bottom surface of the support arm is spaced a loading distance from the actuation plate so that the bottom ends of the secondary lift pins contact the actuation plate and the top ends of the secondary lift pins contact the bottom ends of the primary lift pins and the top end of the primary lift pins extend a loading distance from the support surface.

5. The process chamber of claim 4, wherein when in the process position, the top end of the primary lift pins are coplanar with or below the support surface.

6. The process chamber of claim 5, wherein each of the substrate supports comprise one or more heating elements and the primary lift pins comprise a thermally conductive material.

7. The process chamber of claim 5, wherein the bottom end of each of the primary lift pins are rounded and the top end of each of the secondary lift pins are flat.

8. The process chamber of claim 5, wherein the top end portion of the primary lift pins are flared and the openings in the substrate supports have a complementary flared surface to prevent the length of the primary lift pin from passing through the bottom surface of the substrate support.

9. The process chamber of claim 8, wherein the primary lift pins and openings in the substrate support are configured to prevent the primary lift pin from tilting greater than 0.33°.

10. The process chamber of claim 9, wherein the primary lift pins have no auxiliary weight to prevent wobble of the primary lift pins.

11. The process chamber of claim 4, wherein the opening in the support arms is sized within 0.005 inches of a diameter of the lower end portion of the secondary lift pins.

12. The process chamber of claim 4, wherein the secondary lift pins and openings in the support arms are configured to prevent the secondary lift pins from tilting greater than 0.33° during movement of the support assembly.

13. The process chamber of claim 4, wherein the secondary lift pins have a bushing positioned along the length of the pin, the bushing has a bottom surface configured to prevent the secondary lift pin from moving beyond the process position.

14. The process chamber of claim 4, wherein the secondary lift pins have a stepped diameter along the length so that an upper portion of the secondary lift pins have a larger diameter than a lower portion of the secondary lift pins and the upper portion and lower portion form a contact surface.

15. The process chamber of claim 4, wherein when the support assembly is in the transfer position, only one of the support arms is positioned over the actuation plate and movement of the support assembly along the rotational axis actuates the secondary lift pins in only the support arm positioned over the actuation plate.

16. The process chamber of claim 1, further comprising at least one removable secondary lift pin block connected to the outer end of the support arm, the removable secondary lift pin block having at least one opening configured to support one of the secondary lift pins.

17. The process chamber of claim 16, wherein the removable secondary lift pin block comprises two openings configured to engage a secondary lift pin and one of the openings is not used.

18. The process chamber of claim 1, further comprising:
a chamber body enclosing a processing volume, the support assembly and actuation plate positioned within the processing volume;
a plurality of process stations within the processing volume having an equal number to a number of the substrate supports; and
an access port in a side of the chamber body,
wherein the actuation plate is aligned with one of the process stations so that a substrate is loaded and/or unloaded directly onto a substrate support aligned with a process station.

\* \* \* \* \*